(12) United States Patent
Kajiwara et al.

(10) Patent No.: US 11,043,452 B2
(45) Date of Patent: Jun. 22, 2021

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Yosuke Kajiwara, Yokohama (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/802,295

(22) Filed: Feb. 26, 2020

(65) Prior Publication Data
US 2020/0328146 A1 Oct. 15, 2020

(30) Foreign Application Priority Data
Apr. 15, 2019 (JP) .............................. JP2019-076929

(51) Int. Cl.
*H01L 23/528* (2006.01)
*H01L 29/423* (2006.01)
(Continued)

(52) U.S. Cl.
CPC .......... *H01L 23/528* (2013.01); *H01L 23/535* (2013.01)

(58) Field of Classification Search
CPC ........................... H01L 23/528; H01L 23/535
See application file for complete search history.

(56) References Cited

U.S. PATENT DOCUMENTS

| 8,154,079 | B2 | 4/2012 | Matsushita et al. |
| 10,109,715 | B2 | 10/2018 | Kajiwara et al. |

(Continued)

FOREIGN PATENT DOCUMENTS

| JP | 5072862 B2 | 11/2012 |
| JP | 2015-177016 A | 10/2015 |

(Continued)

*Primary Examiner* — Herve-Louis Y Assouman
(74) *Attorney, Agent, or Firm* — Oblon, McClelland, Maier & Neustadt, L.L.P.

(57) ABSTRACT

According to one embodiment, a semiconductor device includes first to fourth electrodes, a semiconductor layer, a first extension conductive layer, first and second electrode connection portions, and an insulating member. The first to fourth electrodes extend along a first direction. The first electrode is between the second and third electrodes in a second direction. The second direction crosses the first direction. The first extension conductive layer extends along the first direction and is electrically connected to the first electrode. The fourth electrode is between the first and third electrodes in the second direction. The first electrode connection portion is electrically connected to the first electrode. The second electrode connection portion is electrically connected to the second and fourth electrodes. The insulating member includes a first insulating portion. The first insulating portion is between the second electrode connection portion and a portion of the first electrode.

20 Claims, 14 Drawing Sheets

(51) Int. Cl.
  *H01L 23/52*   (2006.01)
  *H01L 29/20*   (2006.01)
  *H01L 23/31*   (2006.01)
  *H01L 23/535*  (2006.01)
  *H01L 29/417*      (2006.01)
  *H01L 29/10*       (2006.01)
  *H01L 29/40*       (2006.01)
  *H01L 29/778*      (2006.01)

(56) References Cited

U.S. PATENT DOCUMENTS

| | | | |
|---|---|---|---|
| 2009/0237186 A1* | 9/2009 | Onda | H01P 3/003 |
| | | | 333/238 |
| 2015/0263107 A1 | 9/2015 | Kobayashi | |
| 2019/0378894 A1 | 12/2019 | Yamamoto et al. | |

FOREIGN PATENT DOCUMENTS

| | | |
|---|---|---|
| JP | 2017-174937 A | 9/2017 |
| WO | WO 2018/155668 A1 | 8/2018 |

* cited by examiner

SEMICONDUCTOR DEVICE

CROSS-REFERENCE TO RELATED APPLICATIONS

This application is based upon and claims the benefit of priority from Japanese Patent Application No. 2019-076929, filed on Apr. 15, 2019; the entire contents of which are incorporated herein by reference.

FIELD

Embodiments described herein relate generally to a semiconductor device.

BACKGROUND

Stable operations of a semiconductor device are desirable.

DETAILED DESCRIPTION

Figure 1A:
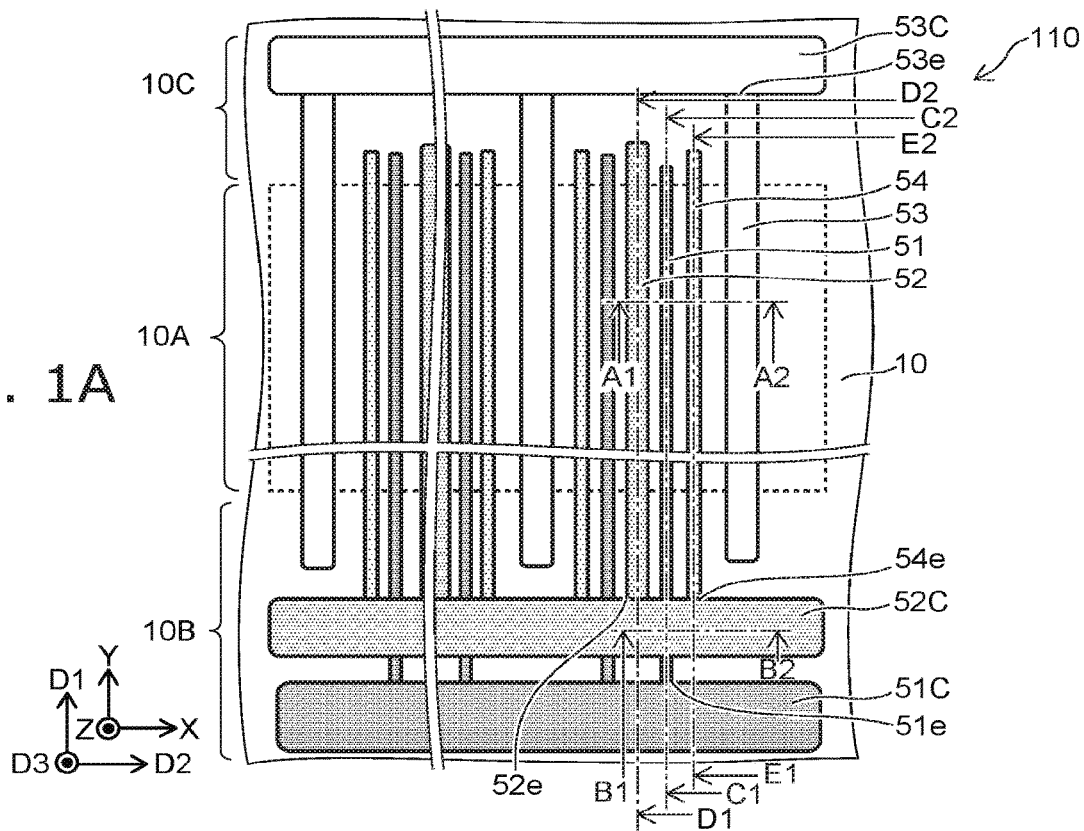
FIG. 1A to FIG. 1C are schematic views illustrating a semiconductor device according to a first embodiment.

According to one embodiment, a semiconductor device includes a first electrode, a second electrode, a third electrode, a fourth electrode, a semiconductor layer, a first extension conductive layer, a first electrode connection portion, a second electrode connection portion, and an insulating member. The first to fourth electrodes extend along a first direction. A position of the first electrode in a second direction is between a position of the second electrode in the second direction and a position of the third electrode in the second direction. The second direction crosses the first direction. A direction from the semiconductor layer toward the first electrode, a direction from the semiconductor layer toward the second electrode, and a direction from the semiconductor layer toward the third electrode are aligned with a third direction crossing a first plane including the first direction and the second direction. The first extension conductive layer extends along the first direction and is electrically connected to the first electrode. The first electrode is between the semiconductor layer and the first extension conductive layer in the third direction. A direction from the first extension conductive layer toward the fourth electrode is aligned with the second direction. A position of the fourth electrode in the second direction is between the position of the first electrode in the second direction and the position of the third electrode in the second direction. The first electrode connection portion is electrically connected to the first electrode. The second electrode connection portion is electrically connected to the second electrode and the fourth electrode. A position of the second electrode connection portion in the first direction is between a position of the first electrode connection portion in the first direction and a position of the third electrode in the first direction. The insulating member includes a first insulating portion. The first insulating portion is between the second electrode connection portion and a portion of the first electrode in the third direction.

According to another embodiment, a semiconductor device includes a first electrode, a second electrode, a third electrode, a fourth electrode, a semiconductor layer, a first extension conductive layer, a second extension conductive layer, a first electrode connection portion, a second electrode connection portion, and an insulating member. The first to fourth electrodes extend along a first direction. A position of the first electrode in a second direction is between a position of the second electrode in the second direction and a position of the third electrode in the second direction. The second direction crosses the first direction. A direction from the semiconductor layer toward the first electrode, a direction from the semiconductor layer toward the second electrode, and a direction from the semiconductor layer toward the third electrode are aligned with a third direction crossing a first plane including the first direction and the second direction. The first extension conductive layer extends along the first direction and is electrically connected to the first electrode. The first electrode is between the semiconductor layer and the first extension conductive layer in the third direction. The second extension conductive layer extends along the first direction and is electrically connected to the second electrode. The second electrode is between the semiconductor layer and the second extension conductive layer in the third direction. A direction from the first extension conductive layer toward the fourth electrode is aligned with the second direction. A position of the fourth electrode in the second direction is between the position of the first electrode in the second direction and the position of the third electrode in the second direction. The first electrode connection portion is electrically connected to the first electrode. The second electrode connection portion is electrically connected to the second electrode and the fourth electrode. A position of the first electrode connection portion in the first direction is between a position of the second electrode connection portion in the first direction and a position of the third electrode in the first direction. The insulating member includes a first insulating portion. The first insulating portion is between the first electrode connection portion and a portion of the second extension conductive layer in the third direction.

According to another embodiment, a semiconductor device includes a first electrode, a second electrode, a third electrode, a fourth electrode, a semiconductor layer, a first pad part, a first connection member, and a second connection member. The first to fourth electrodes extend along a first direction. A position of the first electrode in a second direction is between a position of the second electrode in the second direction and a position of the third electrode in the second direction. The second direction crosses the first direction. A position of the fourth electrode in the second direction is between the position of the first electrode in the second direction and the position of the third electrode in the second direction. A direction from the semiconductor layer toward the first electrode, a direction from the semiconductor layer toward the second electrode, a direction from the semiconductor layer toward the third electrode, and a direction from the semiconductor layer toward the fourth electrode are aligned with a third direction crossing a first plane including the first direction and the second direction. A first electrode portion of the first electrode, a second electrode portion of the second electrode, a third electrode portion of the third electrode, and a fourth electrode portion of the fourth electrode are between the semiconductor layer and the first pad part. The first connection member electrically connects the first pad part to the second electrode and is provided between the first pad part and the second electrode. The second connection member electrically connects the first pad part to the fourth electrode and is provided between the first pad part and the fourth electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1A to FIG. 1C and FIG. 2A to FIG. 2C are schematic views illustrating a semiconductor device according to a first embodiment.

Figure 1B:
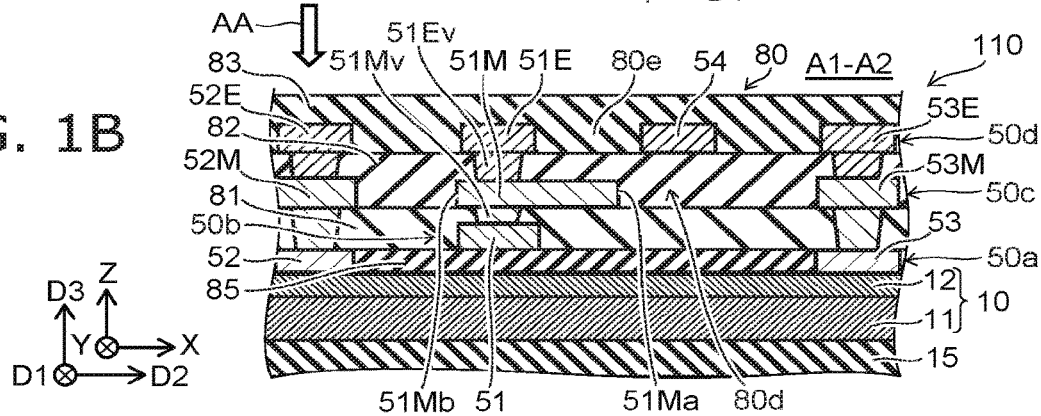
Figure 1C:
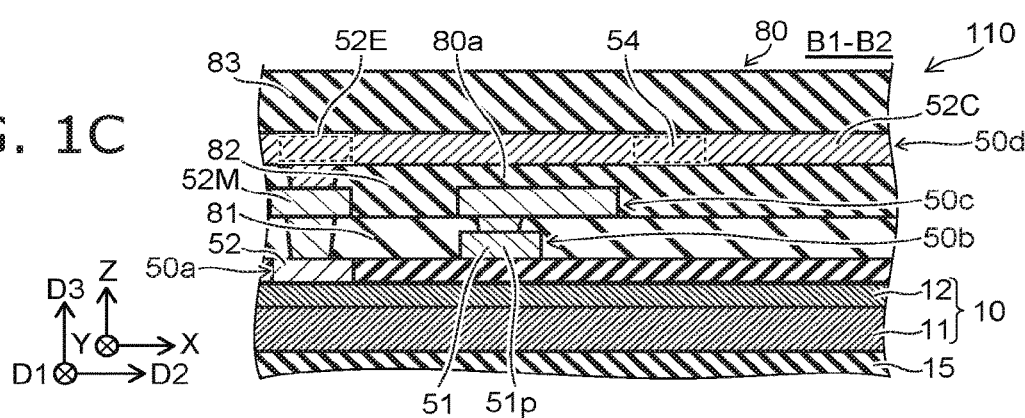
Figure 2A:
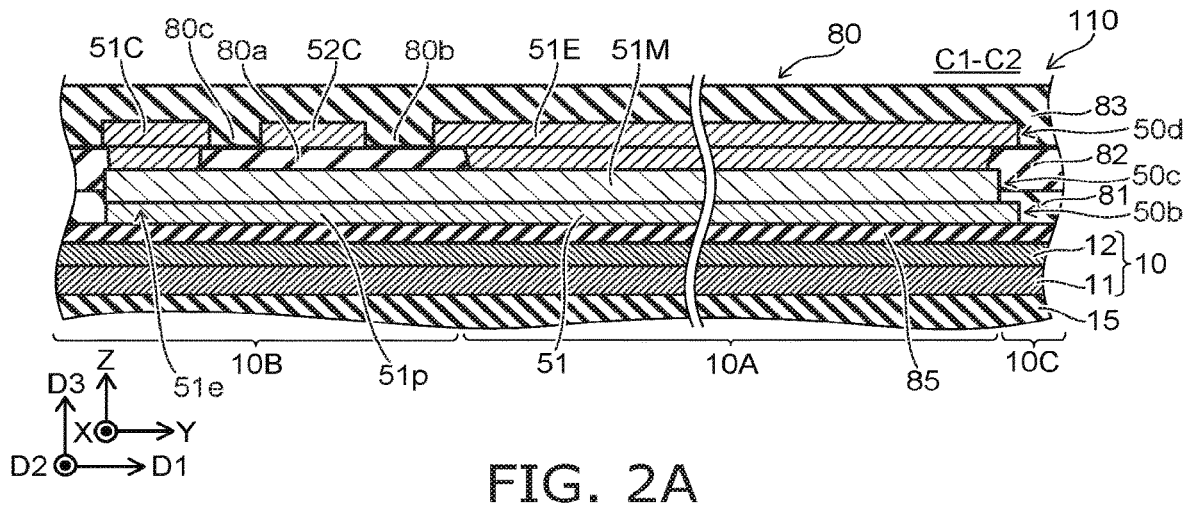
FIG. 2A to FIG. 2C are schematic views illustrating the semiconductor device according to the first embodiment.
Figure 2B:
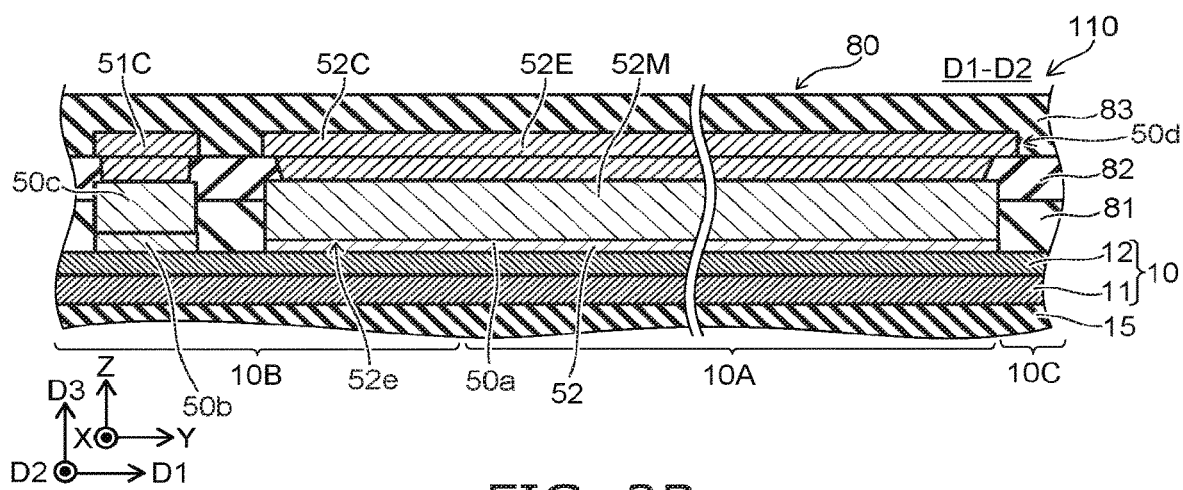
Figure 2C:
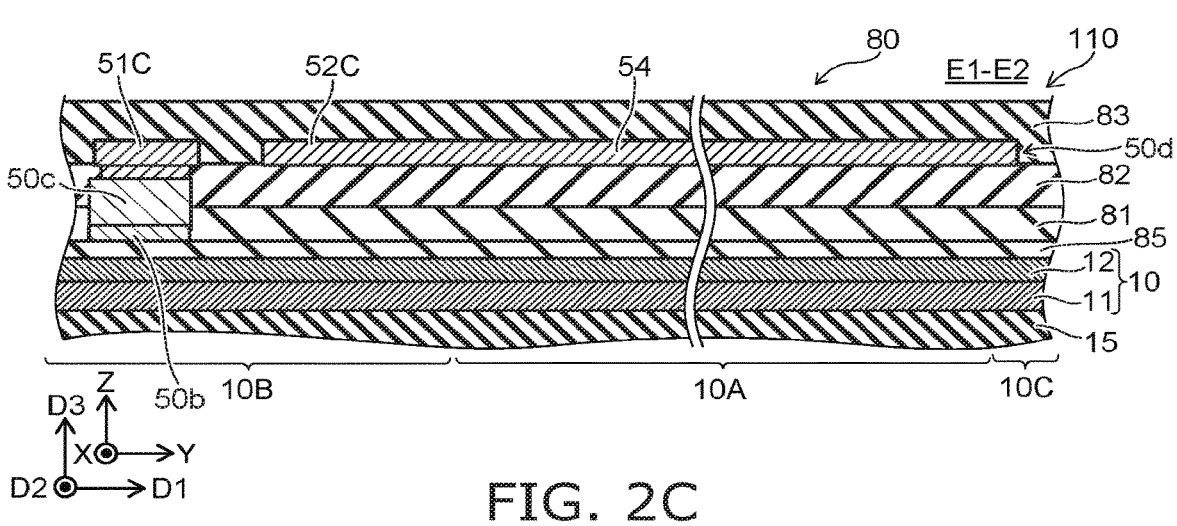

FIG. 1A is a plan view as viewed along arrow AA of FIG. 1B. FIG. 1B is a line A1-A2 cross-sectional view of FIG. 1A. FIG. 1C is a line B1-B2 cross-sectional view of FIG. 1A. FIG. 2A is a line C1-C2 cross-sectional view of FIG. 1A. FIG. 2B is a line D1-D2 cross-sectional view of FIG. 1A. FIG. 2C is a line E1-E2 cross-sectional view of FIG. 1A.

As shown in FIG. 1A and FIG. 1B, the semiconductor device 110 according to the embodiment includes a semiconductor layer 10, a first electrode 51, a second electrode 52, a third electrode 53, a fourth electrode 54, a first extension conductive layer 51E, a first electrode connection portion 51C, a second electrode connection portion 52C, and an insulating member 80.

In the example, the semiconductor layer 10 is provided on a substrate 15 (e.g., a silicon substrate). The semiconductor layer 10 includes, for example, a first semiconductor region 11 and a second semiconductor region 12. The first semiconductor region 11 is between the substrate 15 and the second semiconductor region 12. The first semiconductor region 11 includes, for example, $Al_{x1}Ga_{1-x1}N$ ($0 \le x1 < 1$). The first semiconductor region 11 includes, for example, GaN. The second semiconductor region 12 includes, for example, $Al_{x2}Ga_{1-x2}N$ ($0 < x2 \le 1$ and $x1 < x2$). The second semiconductor region 12 includes, for example, AlGaN. In the embodiment, a buffer layer, etc. (not illustrated in FIG. 1B, etc.) may be provided between the first semiconductor region 11 and the substrate 15. An AlN layer (not illustrated in FIG. 1B, etc.) may be provided between the first semiconductor region 11 and the second semiconductor region 12.

As shown in FIG. 1A, the semiconductor layer 10 may include a first region 10A, a second region 10B, and a third region 10C. The first region 10A is, for example, an active region. The second region 10B is one connection region. The third region 10C is another connection region. The first region 10A is between the second region 10B and the third region 10C in a first direction D1. For example, the second region 10B corresponds to one element separation region. For example, the third region 10C corresponds to one element separation region.

The first electrode 51, the second electrode 52, the third electrode 53, and the fourth electrode 54 extend along the first direction D1. The first electrode 51, the second electrode 52, the third electrode 53, and the fourth electrode 54 are substantially parallel to each other.

The first direction D1 is taken as a Y-axis direction. One direction perpendicular to the Y-axis direction is taken as an X-axis direction. A direction perpendicular to the Y-axis direction and the X-axis direction is taken as a Z-axis direction.

A second direction D2 crosses the first direction D1. Hereinbelow, the second direction D2 is taken as the X-axis direction.

As shown in FIG. 1A and FIG. 1B, the position of the first electrode 51 in the second direction D2 is between the position of the second electrode 52 in the second direction D2 and the position of the third electrode 53 in the second direction D2.

Multiple first electrodes 51, multiple second electrodes 52, and multiple third electrodes 53 are provided in the example. As shown in FIG. 1A, for example, the position in the second direction D2 of one of the multiple first electrodes 51 is between the position in the second direction D2 of one of the multiple second electrodes 52 and the position in the second direction D2 of one of the multiple third electrodes 53.

As shown in FIG. 1B, the direction from the semiconductor layer 10 toward the first electrode 51, the direction from the semiconductor layer 10 toward the second electrode 52, and the direction from the semiconductor layer 10 toward the third electrode 53 are aligned with a third direction D3. The third direction D3 crosses a first plane (e.g., the X-Y plane) including the first direction D1 and the second direction D2. Hereinbelow, the third direction D3 is taken as the Z-axis direction.

As shown in FIG. 1B and FIG. 2A, the first extension conductive layer 51E extends along the first direction D1. The first extension conductive layer 51E is electrically connected to the first electrode 51. The first electrode 51 is between the semiconductor layer 10 and the first extension conductive layer 51E in the third direction D3.

As shown in FIG. 1B and FIG. 2A, a first intermediate conductive layer 51M is provided in the example. The first extension conductive layer 51E is electrically connected to the first electrode 51 by the first intermediate conductive layer 51M. In the example, the first extension conductive layer 51E is electrically connected to the first intermediate conductive layer 51M by a connection conductive part 51Ev. In the example, the first intermediate conductive layer 51M is electrically connected to the first electrode 51 by a connection conductive part 51Mv. Each boundary between the first electrode 51, the connection conductive part 51Mv, the first intermediate conductive layer 51M, the connection conductive part 51Ev, and the first extension conductive layer 51E may be distinct or indistinct. At least a portion of these portions may have a substantially continuous body.

As shown in FIG. 1B, the direction from the first extension conductive layer 51E toward the fourth electrode 54 is aligned with the second direction D2. The position of the fourth electrode 54 in the second direction D2 is between the position of the first electrode 51 in the second direction D2 and the position of the third electrode 53 in the second direction D2.

As shown in FIG. 1A and FIG. 2A, the first electrode connection portion 51C is electrically connected to the first electrode 51. For example, the first electrode connection portion 51C is electrically connected to an end portion 51e of the first electrode 51.

As shown in FIG. 1A and FIG. 2B, the second electrode connection portion 52C is electrically connected to the second electrode 52 and the fourth electrode 54. For example, the second electrode connection portion 52C is electrically connected to an end portion 52e of the second electrode 52 and an end portion 54e of the fourth electrode 54.

As shown in FIG. 1A, the position of the second electrode connection portion 52C in the first direction D1 is between the position of the first electrode connection portion 51C in the first direction D1 and the position of the third electrode 53 in the first direction D1.

As shown in FIG. 1A, a third electrode connection portion 53C is further provided in the example. The third electrode connection portion 53C is electrically connected to an end portion 53e of the third electrode 53.

The position in the first direction D1 of the second electrode connection portion 52C is between the position in the first direction D1 of the first electrode connection portion 51C and the position in the first direction D1 of the third electrode connection portion 53C.

The first electrode connection portion 51C and the second electrode connection portion 52C are provided in the second region 10B. The third electrode connection portion 53C is provided in the third region 10C.

For example, the first electrode connection portion 51C electrically connects the multiple first electrodes 51. For example, the second electrode connection portion 52C electrically connects the multiple second electrodes 52. For example, the third electrode connection portion 53C electrically connects the multiple third electrodes 53. For example, the first electrode connection portion 51C, the second electrode connection portion 52C, and the third electrode connection portion 53C extend along the second direction D2.

As shown in FIG. 1C and FIG. 2A, the insulating member 80 includes a first insulating portion 80a. In the semiconductor device 110, the first insulating portion 80a is between the second electrode connection portion 52C and a portion 51p of the first electrode 51 in the third direction D3. Thereby, the first electrode 51 and the second electrode connection portion 52C are electrically insulated from each other.

For example, the first electrode 51 functions as a gate electrode. For example, the second electrode 52 functions as a source electrode. For example, the third electrode 53 functions as a drain electrode. The semiconductor device 110 is, for example, a transistor. For example, the fourth electrode 54 functions as a field plate. The concentration of the electric field can be suppressed by the field plate; and more stable operations are obtained.

In the semiconductor device 110, the first extension conductive layer 51E that is electrically connected to the first electrode 51 is provided. Thereby, the resistance of the first electrode 51 (e.g., the gate electrode) can be low. The gate delay can be suppressed thereby. Stable operations are obtained easily.

As recited above, the first electrode 51 of the lower layer and the second electrode connection portion 52C of the upper layer are electrically insulated from each other by the first insulating portion 80a of the insulating member 80. Thereby, the surface area of the region (e.g., the second region 10B) electrically connecting the fourth electrode 54 to the second electrode 52 can be small. In the embodiment, a small size of the device can be maintained. For example, the source-drain parasitic capacitance can be small. Also, the fourth electrode 54 can function as a field plate; and the electric field concentration can be suppressed. The gate resistance can be reduced by the first extension conductive layer 51E. The gate delay can be suppressed thereby. Stable operations are obtained. According to the embodiment, a semiconductor device can be provided in which stable operations are obtained.

As shown in FIG. 2A, the insulating member 80 may further include a second insulating portion 80b. The second insulating portion 80b is between the second electrode connection portion 52C and the first extension conductive layer 51E.

As shown in FIG. 2A, the insulating member 80 may further include a third insulating portion 80c. The third insulating portion 80c is between the second electrode connection portion 52C and the first electrode connection portion 51C.

As shown in FIG. 1B, the insulating member 80 may further include a fourth insulating portion 80d. The fourth insulating portion 80d is between the semiconductor layer 10 and the fourth electrode 54.

As shown in FIG. 1B, the insulating member 80 may further include a fifth insulating portion 80e. The fifth insulating portion 80e is between the first extension conductive layer 51E and the fourth electrode 54.

In the example as shown in FIG. 1B, a portion of the first intermediate conductive layer 51M extends toward the third electrode 53 side. At least a portion of the first intermediate conductive layer 51M is between the first electrode 51 and the first extension conductive layer 51E in the third direction D3. The first intermediate conductive layer 51M includes a first end portion 51Ma. The first intermediate conductive layer 51M may include a second end portion 51Mb. The direction from the second end portion 51Mb toward the first end portion 51Ma is aligned with the second direction D2. The position of the first end portion 51Ma in the second direction D2 is between the position of the first electrode 51 in the second direction D2 and the position of the third electrode 53 in the second direction D2. In the example, the position of the fourth electrode 54 in the second direction D2 is between the position of the first end portion 51Ma in the second direction and the position of the third electrode 53 in the second direction D2. At least a portion of the fourth electrode 54 may overlap the first intermediate conductive layer 51M in the third direction D3. For example, the fourth electrode 54 may overlap the first end portion 51Ma in the third direction D3.

For example, the first intermediate conductive layer 51M that includes such a protruded first end portion 51Ma functions as a field plate. The concentration of the electric field can be suppressed; and more stable operations are obtained.

As shown in FIG. 1B and FIG. 2B, a second extension conductive layer 52E and a second intermediate conductive layer 52M may be provided. The second intermediate conductive layer 52M is between the second electrode 52 and the second extension conductive layer 52E in the third direction D3. The second electrode 52, the second intermediate conductive layer 52M, and the second extension conductive layer 52E are electrically connected to each other.

As shown in FIG. 1B, a third extension conductive layer 53E and a third intermediate conductive layer 53M may be provided. The third intermediate conductive layer 53M is between the third electrode 53 and the third extension conductive layer 53E in the third direction D3. The third electrode 53, the third intermediate conductive layer 53M, and the third extension conductive layer 53E are electrically connected to each other.

As shown in FIG. 1B, the semiconductor device 110 includes, for example, a first conductive layer 50a, a second conductive layer 50b, a third conductive layer 50c, and a fourth conductive layer 50d. For example, the position of the first conductive layer 50a in the third direction D3 is between the position of the semiconductor layer 10 in the third direction D3 and the position of the fourth conductive layer 50d in the third direction D3. The position of the second conductive layer 50b in the third direction D3 is between the position of the first conductive layer 50a in the third direction D3 and the position of the fourth conductive layer 50d in the third direction D3. The position of the third conductive layer 50c in the third direction D3 is between the position of the second conductive layer 50b in the third direction D3 and the position of the fourth conductive layer 50d in the third direction D3.

For example, the second electrode 52 and the third electrode 53 are formed from the first conductive layer 50a. The first electrode 51 is formed from the second conductive layer 50b. The first intermediate conductive layer 51M, the second intermediate conductive layer 52M, and the third intermediate conductive layer 53M are formed from the third conductive layer 50c. The fourth electrode 54, the first extension conductive layer 51E, the second extension conductive layer 52E, and the third extension conductive layer 53E are formed from the fourth conductive layer 50d.

The first conductive layer 50a and the third conductive layer 50c may be formed to have a continuous body. The second electrode 52 and the second intermediate conductive layer 52M may be formed to have a continuous body. The first conductive layer 50a and the third conductive layer 50c may be linked seamlessly. The second electrode 52 and the second intermediate conductive layer 52M may be linked seamlessly.

In the example as shown in FIG. 2B and FIG. 2C, the first electrode connection portion 51C includes a portion of the second conductive layer 50b, a portion of the third conductive layer 50c, and a portion of the fourth conductive layer 50d.

As shown in FIG. 1B, the insulating member 80 includes a first insulating layer 81, a second insulating layer 82, and a third insulating layer 83. The boundaries between these insulating layers may be distinct or indistinct. For example, the position of the first insulating layer 81 in the third direction D3 is between the position of the semiconductor layer 10 in the third direction D3 and the position of the third insulating layer 83 in the third direction D3. For example, the position of the second insulating layer 82 in the third direction D3 is between the position of the first insulating layer 81 in the third direction D3 and the position of the third insulating layer 83 in the third direction D3.

In the example as shown in FIG. 1C, the first insulating portion 80a of the insulating member 80 corresponds to a portion of the second insulating layer 82.

As shown in FIG. 2A, the second insulating portion 80b and the third insulating portion 80c correspond to a portion of the third insulating layer 83.

In the example as shown in FIG. 1B, the fourth insulating portion 80d corresponds to a portion of the first insulating layer 81 and a portion of the second insulating layer 82.

As shown in FIG. 1B, the fifth insulating portion 80e corresponds to a portion of the third insulating layer 83.

In the example as shown in FIG. 1B, the semiconductor device 110 includes an insulating film 85. The insulating film 85 is provided between the semiconductor layer 10 and the first electrode 51. For example, the insulating film 85 functions as a gate insulating film.

Several examples of the semiconductor device according to the embodiment will now be described. Portions that are different from the semiconductor device 110 recited above will be described.

Figure 3A:
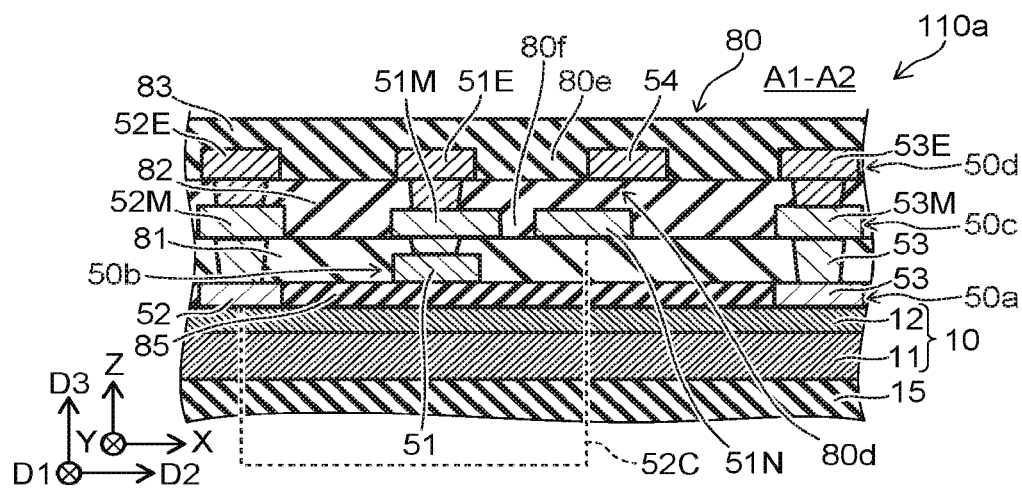
FIG. 3A and FIG. 3B are schematic cross-sectional views illustrating semiconductor devices according to the first embodiment.
Figure 3B:
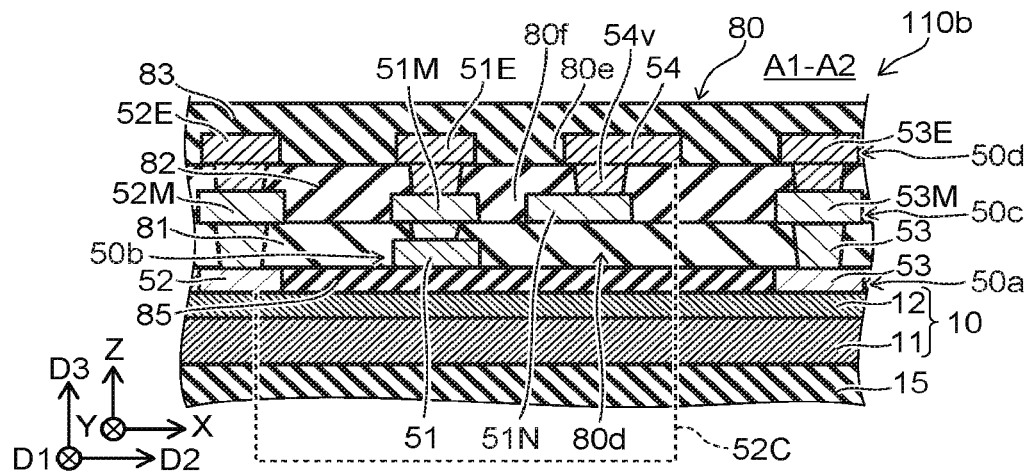

FIG. 3A and FIG. 3B are schematic cross-sectional views illustrating semiconductor devices according to the first embodiment.

These drawings are cross-sectional views corresponding to a line A1-A2 cross section of FIG. 1A.

As shown in FIG. 3A, a semiconductor device 110a according to the embodiment includes an intermediate electrode 51N. The intermediate electrode 51N is electrically connected to the second electrode 52. For example, the electrical connection is performed by the second electrode connection portion 52C (the broken line of FIG. 3A).

The position of the intermediate electrode 51N in the third direction D3 is between the position of the first electrode 51 in the third direction D3 and the position of the first extension conductive layer 51E in the third direction D3. For example, the intermediate electrode 51N is formed from the third conductive layer 50c. For example, the intermediate electrode 51N extends along the first direction D1.

The position of the intermediate electrode 51N in the second direction D2 is between the position of the first electrode 51 in the second direction D2 and the position of the third electrode 53 in the second direction D2.

For example, the intermediate electrode 51N functions as a field plate. In the semiconductor device 110a, for example, two field plates (the intermediate electrode 51N and the fourth electrode 54) are provided. The concentration of the electric field can be suppressed further thereby. For example, the gate-drain capacitance can be small. Switching loss can be suppressed. More stable operations are obtained.

As shown in FIG. 3A, the insulating member 80 may include a sixth insulating portion 80f. The sixth insulating portion 80f is provided between the first intermediate conductive layer 51M and the intermediate electrode 51N. The sixth insulating portion 80f is, for example, a portion of the second insulating layer 82.

As shown in FIG. 3B, the intermediate electrode 51N is provided also in a semiconductor device 110b according to the embodiment. A connection portion 54v is provided in the semiconductor device 110b. The connection portion 54v electrically connects the intermediate electrode 51N to the fourth electrode 54. For example, the fourth electrode 54 is electrically connected to the second electrode 52 by the second electrode connection portion 52C (the broken line of FIG. 3B). The intermediate electrode 51N may be electrically connected to the second electrode 52 by the second electrode connection portion 52C. The source resistance can be small thereby. The gate-drain capacitance can be small. Switching loss can be suppressed.

Figure 4:
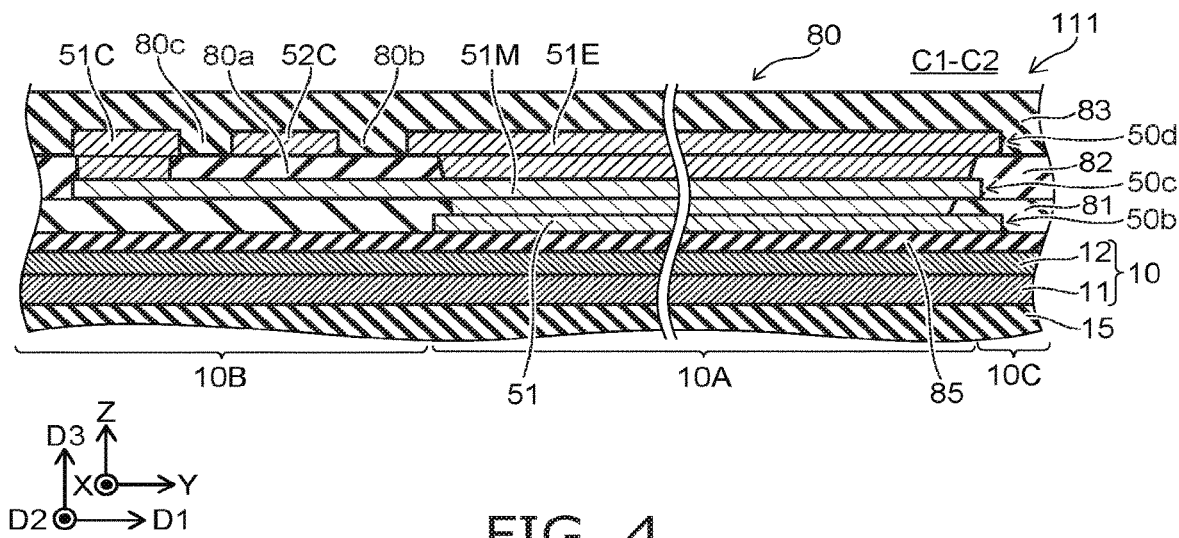
FIG. 4 is a schematic cross-sectional view illustrating a semiconductor device according to the first embodiment.
Figure 5:
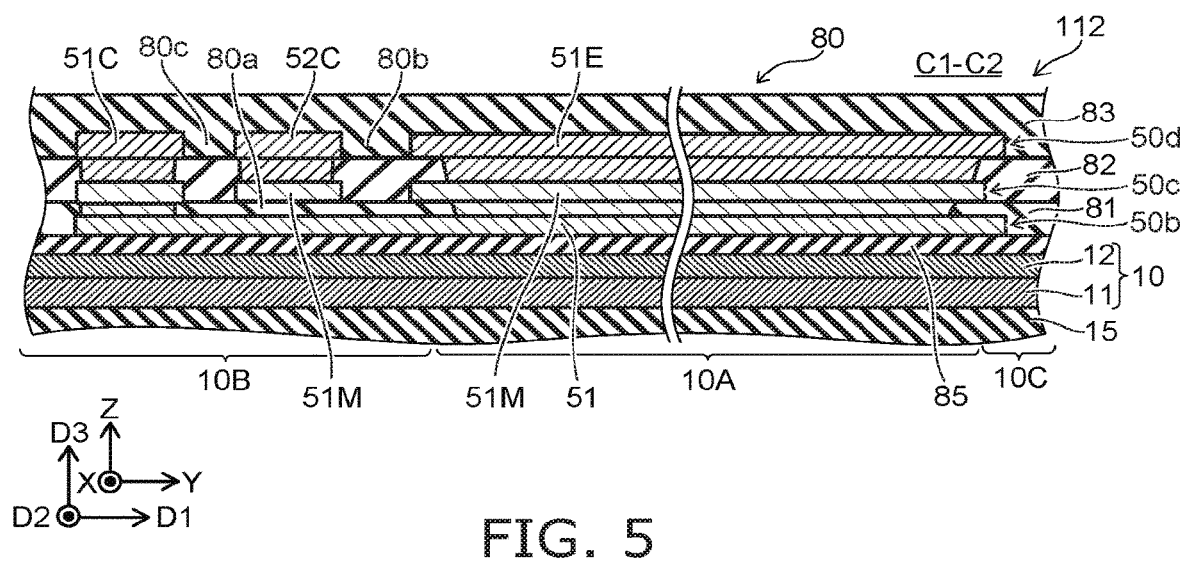
FIG. 5 is a schematic cross-sectional view illustrating a semiconductor device according to the first embodiment.

FIG. 4 and FIG. 5 are schematic cross-sectional views illustrating semiconductor devices according to the first embodiment.

These drawings are cross-sectional views corresponding to the line C1-C2 cross section of FIG. 1A.

In a semiconductor device 111 according to the embodiment as shown in FIG. 4, at least a portion of the first insulating portion 80a of the insulating member 80 is between the first intermediate conductive layer 51M (or the third conductive layer 50c) and the second electrode connection portion 52C. The first electrode 51 is electrically connected to the first electrode connection portion 51C by the first intermediate conductive layer 51M (or the third conductive layer 50c).

In the semiconductor device 112 according to the embodiment as shown in FIG. 5, at least a portion of the first insulating portion 80a of the insulating member 80 is between the first electrode 51 and the first intermediate conductive layer 51M (or the third conductive layer 50c).

In the semiconductor devices 111 and 112 as well, the surface area of the electrical connection region (e.g., the second region 10B) can be small; and a small size of the device can be maintained. The concentration of the electric field can be suppressed by the field plate. For example, the source-drain parasitic capacitance can be small. The gate resistance can be reduced by the first extension conductive layer 51E. According to the embodiment, a semiconductor device can be provided in which stable operations are obtained.

Second Embodiment

FIG. 6A to FIG. 6C and FIG. 7A to FIG. 7C are schematic views illustrating a semiconductor device according to a second embodiment.

Figure 6A:
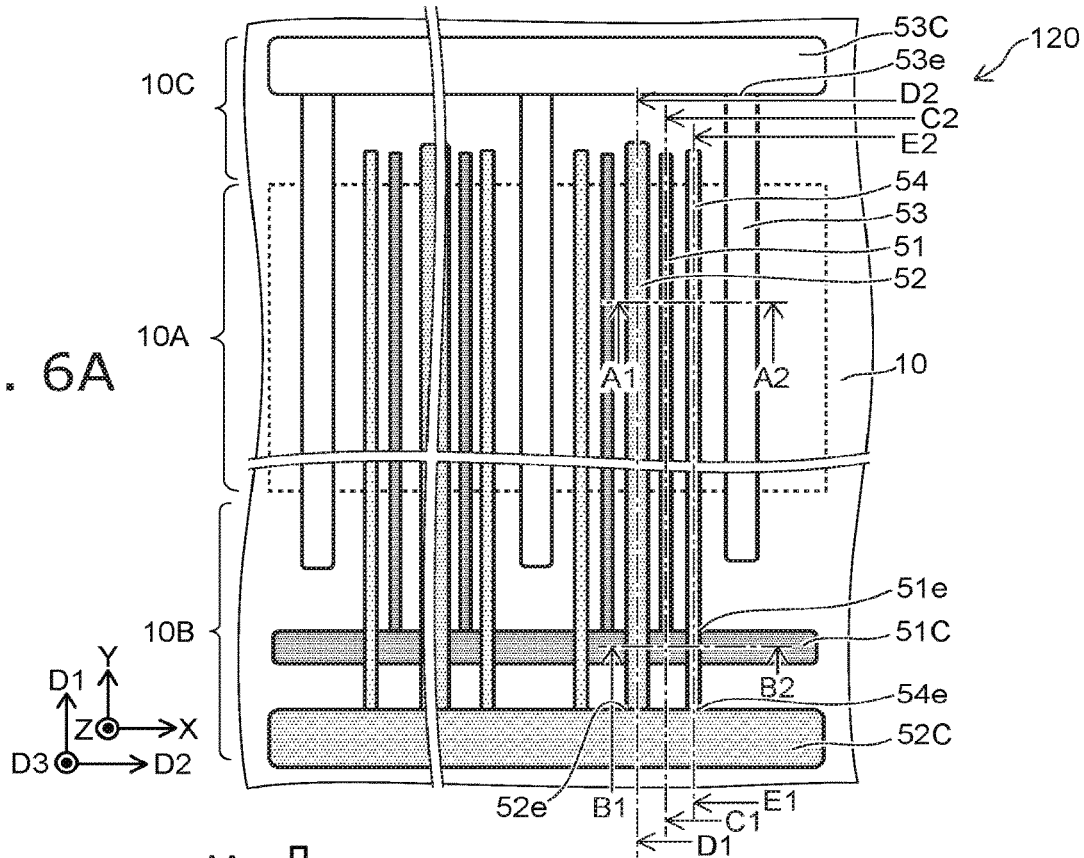
FIG. 6A to FIG. 6C are schematic views illustrating a semiconductor device according to a second embodiment.
Figure 6B:
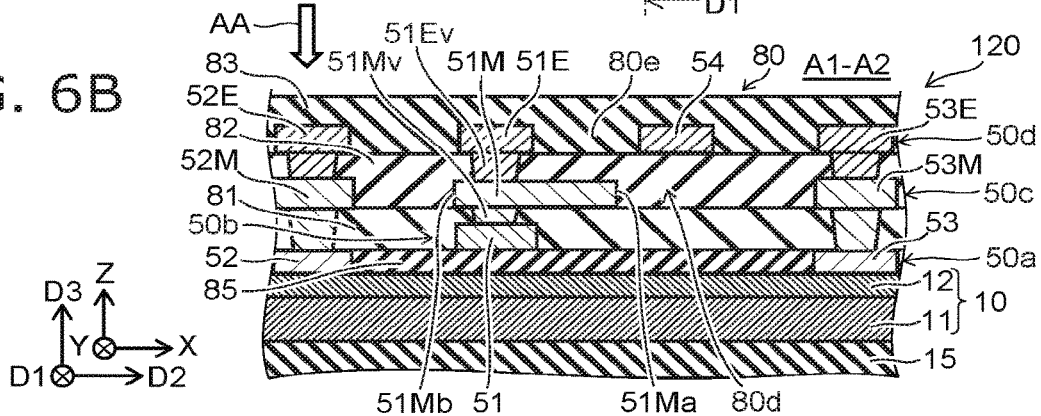
Figure 6C:
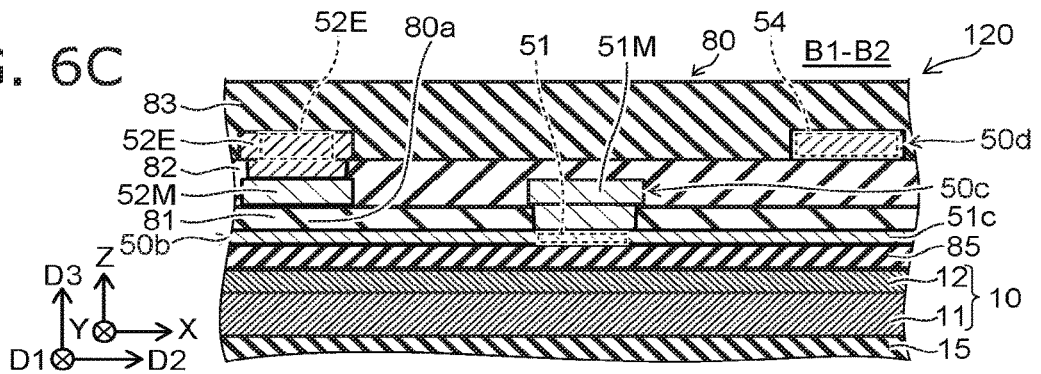
Figure 7A:
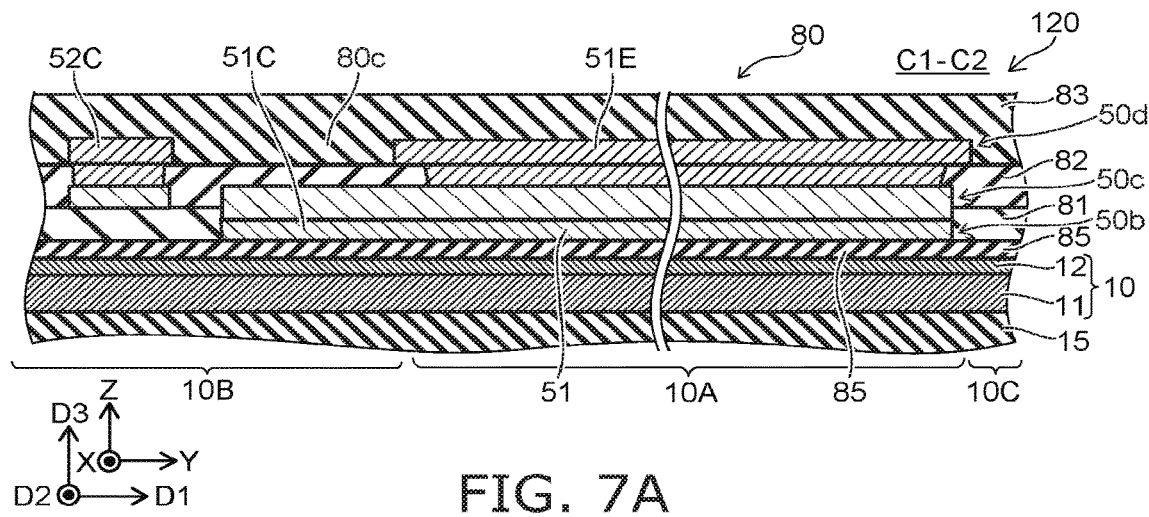
FIG. 7A to FIG. 7C are schematic views illustrating the semiconductor device according to the second embodiment.
Figure 7B:
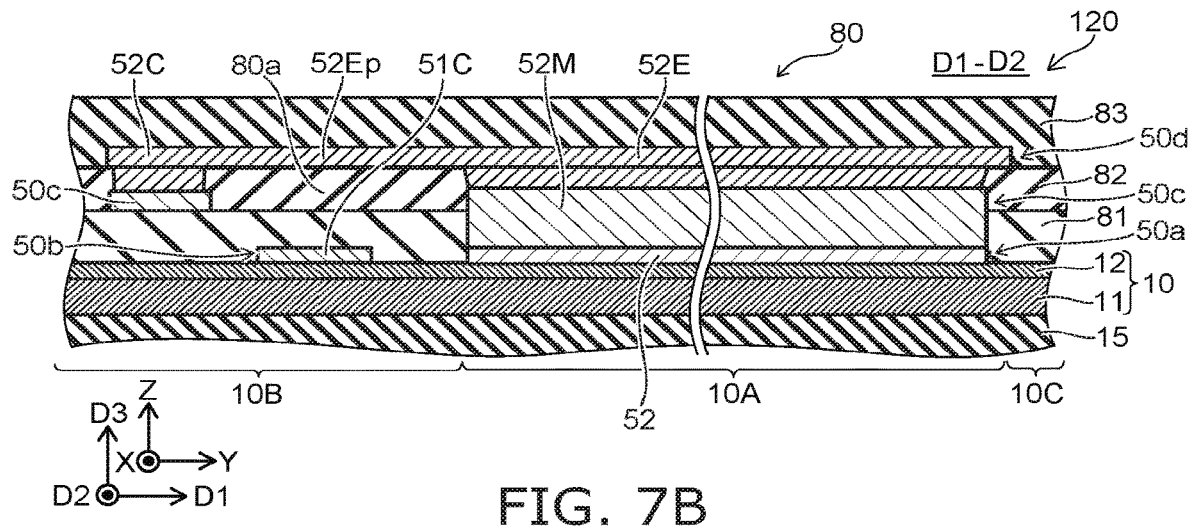
Figure 7C:
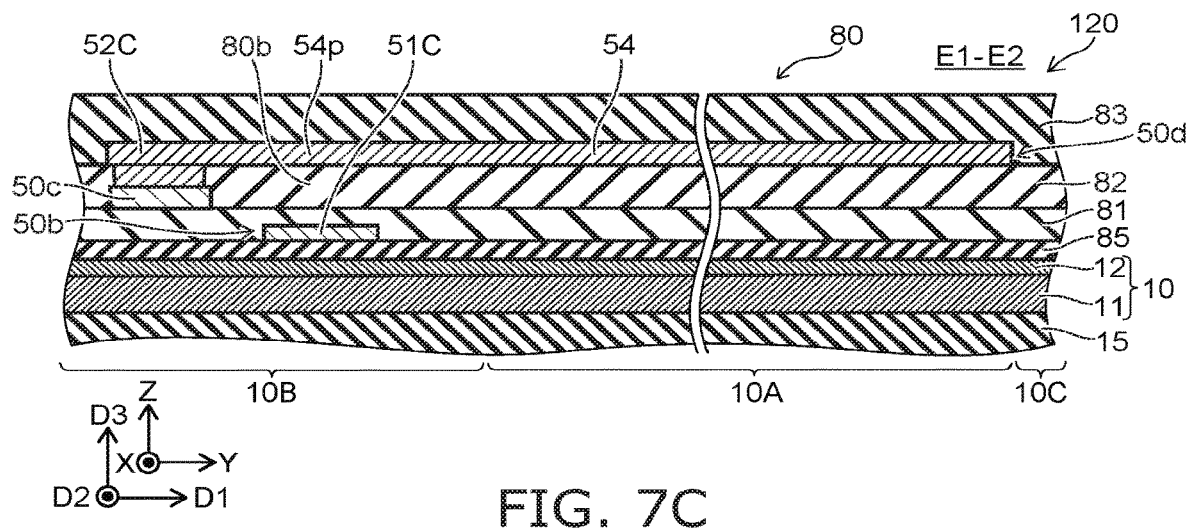

FIG. 6A is a plan view as viewed along arrow AA of FIG. 6B. FIG. 6B is a line A1-A2 cross-sectional view of FIG. 6A. FIG. 6C is a line B1-B2 cross-sectional view of FIG. 6A. FIG. 7A is a line C1-C2 cross-sectional view of FIG. 6A. FIG. 7B is a line D1-D2 cross-sectional view of FIG. 6A. FIG. 7C is a line E1-E2 cross-sectional view of FIG. 6A.

As shown in FIG. 6A and FIG. 6B, the semiconductor device 120 according to the embodiment also includes the semiconductor layer 10, the first electrode 51, the second electrode 52, the third electrode 53, the fourth electrode 54, the first extension conductive layer 51E, the second extension conductive layer 52E, the first electrode connection portion 51C, the second electrode connection portion 52C, and the insulating member 80.

The first to fourth electrodes 51 to 54 extend along the first direction D1 (e.g., the Y-axis direction).

The second direction D2 crosses the first direction D1. The second direction D2 is, for example, the X-axis direction. The third direction D3 crosses the first plane (the X-Y plane) including the first direction D1 and the second direction D2. The third direction D3 is, for example, the Z-axis direction.

The position of the first electrode 51 in the second direction D2 is between the position of the second electrode 52 in the second direction D2 and the position of the third electrode 53 in the second direction D2.

As shown in FIG. 6B, the direction from the semiconductor layer 10 toward the first electrode 51, the direction from the semiconductor layer 10 toward the second electrode 52, and the direction from the semiconductor layer 10 toward the third electrode 53 are aligned with the third direction D3.

The first extension conductive layer 51E extends along the first direction D1 and is electrically connected to the first electrode 51. The first electrode 51 is between the semiconductor layer 10 and the first extension conductive layer 51E in the third direction D3.

The direction from the first extension conductive layer 51E toward the fourth electrode 54 is aligned with the second direction D2. The position of the fourth electrode 54 in the second direction D2 is between the position of the first electrode 51 in the second direction D2 and the position of the third electrode 53 in the second direction D2.

The second extension conductive layer 52E extends along the first direction D1 and is electrically connected to the second electrode 52. The second electrode 52 is between the semiconductor layer 10 and the second extension conductive layer 52E in the third direction D3.

The first electrode connection portion 51C is electrically connected to the first electrode 51 (referring to FIG. 7A). The second electrode connection portion 52C is electrically connected to the second electrode 52 and the fourth electrode 54 (referring to FIG. 7B and FIG. 7C).

As shown in FIG. 6A, the position of the first electrode connection portion 51C in the first direction D1 is between the position of the second electrode connection portion 52C in the first direction D1 and the position of the third electrode 53 in the first direction D1. For example, the first electrode connection portion 51C and the second electrode connection portion 52C are provided in the second region 10B (referring to FIG. 6A).

Thus, the positional relationship in the first direction D1 of the first electrode connection portion 51C and the second electrode connection portion 52C in the semiconductor device 120 is different from that of the semiconductor device 110.

In the semiconductor device 120 as shown in FIG. 7B, the insulating member 80 includes the first insulating portion 80a. As shown in FIG. 6C and FIG. 7B, the first insulating portion 80a is between the first electrode connection portion 51C and a portion 52Ep of the second extension conductive layer 52E in the third direction D3. The first insulating portion 80a is, for example, a portion of the second insulating layer 82.

In the semiconductor device 120, the first electrode connection portion 51C of the lower layer and the second extension conductive layer 52E of the upper layer are electrically insulated from each other by the first insulating portion 80a of the insulating member 80. Thereby, for example, the surface area of the electrical connection region (e.g., the second region 10B) can be small; and a small size of the device can be maintained. The concentration of the electric field can be suppressed by the field plate of the fourth electrode 54. For example, the source-drain parasitic capacitance can be small. The gate resistance can be reduced by the first extension conductive layer 51E. According to the embodiment, a semiconductor device can be provided in which stable operations are obtained.

As shown in FIG. 7C, the insulating member 80 may further include the second insulating portion 80b. The second insulating portion 80b is between the first electrode connection portion 51C and a portion 54p of the fourth electrode 54. The second insulating portion 80b is, for example, a portion of the second insulating layer 82.

As shown in FIG. 7A, the insulating member 80 may further include the third insulating portion 80c. The third insulating portion 80c is between the second electrode connection portion 52C and the first extension conductive layer 51E in the first direction D1. The first electrode connection portion 51C is between the semiconductor layer 10 and the third insulating portion 80c in the third direction D3. The third insulating portion 80c is, for example, a portion of the third insulating layer 83.

As shown in FIG. 6B, the insulating member 80 may further include the fourth insulating portion 80d. The fourth insulating portion 80d is between the semiconductor layer 10 and the fourth electrode 54. The fourth insulating portion 80d is a portion of the second insulating layer 82.

As shown in FIG. 6B, the insulating member 80 may further include the fifth insulating portion 80e. The fifth insulating portion 80e is between the first extension conductive layer 51E and the fourth electrode 54. The fifth insulating portion 80e is a portion of the third insulating layer 83.

As shown in FIG. 6B, the semiconductor device 120 may further include the first intermediate conductive layer 51M. At least a portion of the first intermediate conductive layer 51M is between the first electrode 51 and the first extension conductive layer 51E in the third direction D3. The first intermediate conductive layer 51M includes the first end portion 51Ma. The position of the first end portion 51Ma in the second direction D2 is between the position of the first electrode 51 in the second direction D2 and the position of the third electrode 53 in the second direction D2. The first intermediate conductive layer 51M protrudes toward the third electrode 53 side. The first intermediate conductive layer 51M functions as a field plate. The electric field concentration can be suppressed further thereby. More stable operations are obtained.

In the semiconductor device 120 as shown in FIG. 7B, the first electrode connection portion 51C is formed from the second conductive layer 50b. In the embodiment, the first electrode connection portion 51C may be formed from the first conductive layer 50a.

Figure 8A:
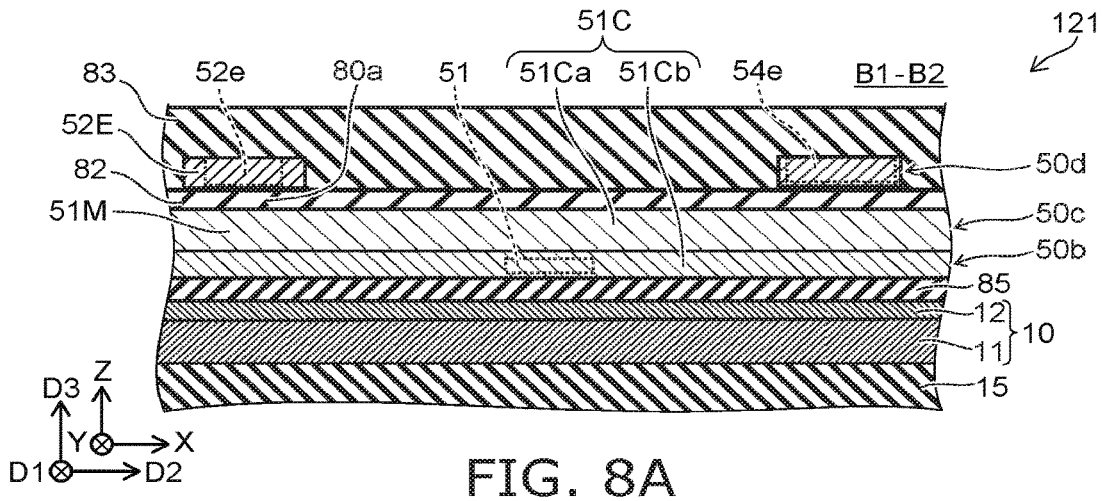
FIG. 8A to FIG. 8C are schematic cross-sectional views illustrating a semiconductor device according to the second embodiment.
Figure 8B:
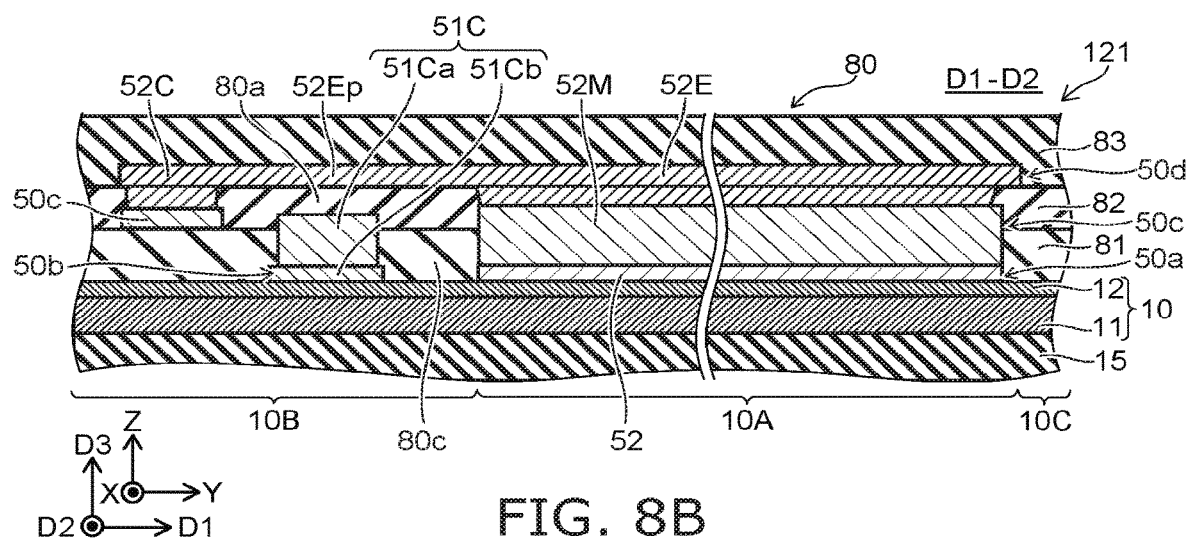
Figure 8C:
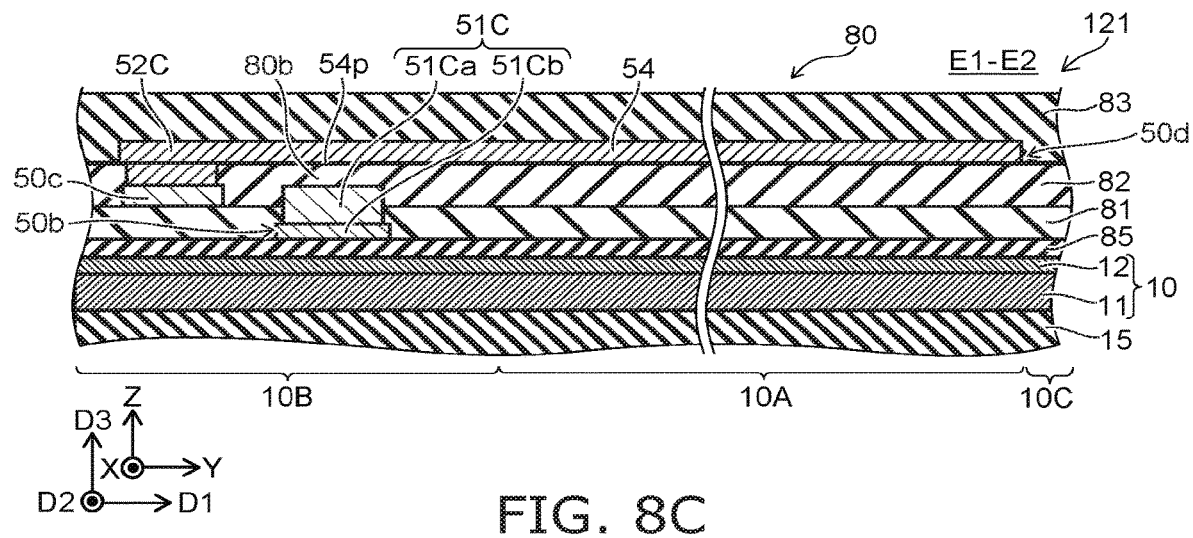

FIG. 8A to FIG. 8C are schematic cross-sectional views illustrating a semiconductor device according to the second embodiment.

FIG. 8A is a cross-sectional view corresponding to a line B1-B2 cross section of FIG. 6A. FIG. 8B is a cross-sectional view corresponding to a line D1-D2 cross section of FIG. 6A. FIG. 8C is a cross-sectional view corresponding to a line E1-E2 cross section of FIG. 6A.

In the example as shown in FIG. 8A to FIG. 8C, the first electrode connection portion 51C includes a first connection conductive layer 51Ca and a second connection conductive layer 51Cb. As shown in FIG. 8A, the direction from the first connection conductive layer 51Ca toward the first intermediate conductive layer 51M is along the first plane (the X-Y plane) recited above. As shown in FIG. 8B, the direction from the first connection conductive layer 51Ca toward the second intermediate conductive layer 52M is along the first plane (the X-Y plane) recited above. The first connection conductive layer 51Ca, the first intermediate conductive layer 51M, and the second intermediate conductive layer 52M are, for example, at least a portion of the third conductive layer 50c.

As shown in FIG. 8A and FIG. 8B, the second connection conductive layer 51Cb is between the semiconductor layer 10 and the first connection conductive layer 51Ca. For example, as shown in FIG. 8B, the direction from the second connection conductive layer 51Cb toward the second electrode 52 is along the first plane (the X-Y plane). The direction from the second connection conductive layer 51Cb toward the first electrode 51 may be along the first plane (the X-Y plane). The second connection conductive layer 51Cb is, for example, at least a portion of the first conductive layer 50a. The second connection conductive layer 51Cb may be, for example, at least a portion of the second conductive layer 50b.

Figure 9A:
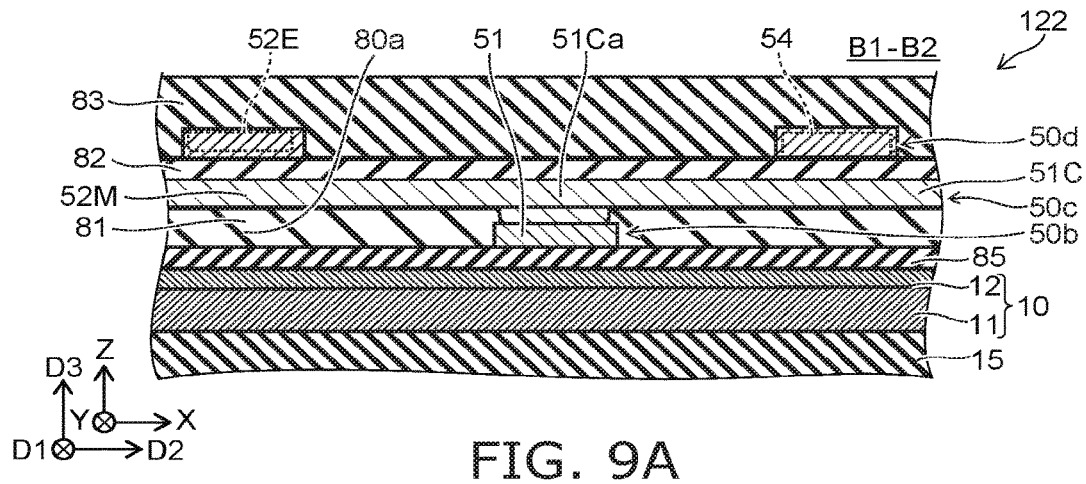
FIG. 9A to FIG. 9C are schematic cross-sectional views illustrating a semiconductor device according to the second embodiment.
Figure 9B:
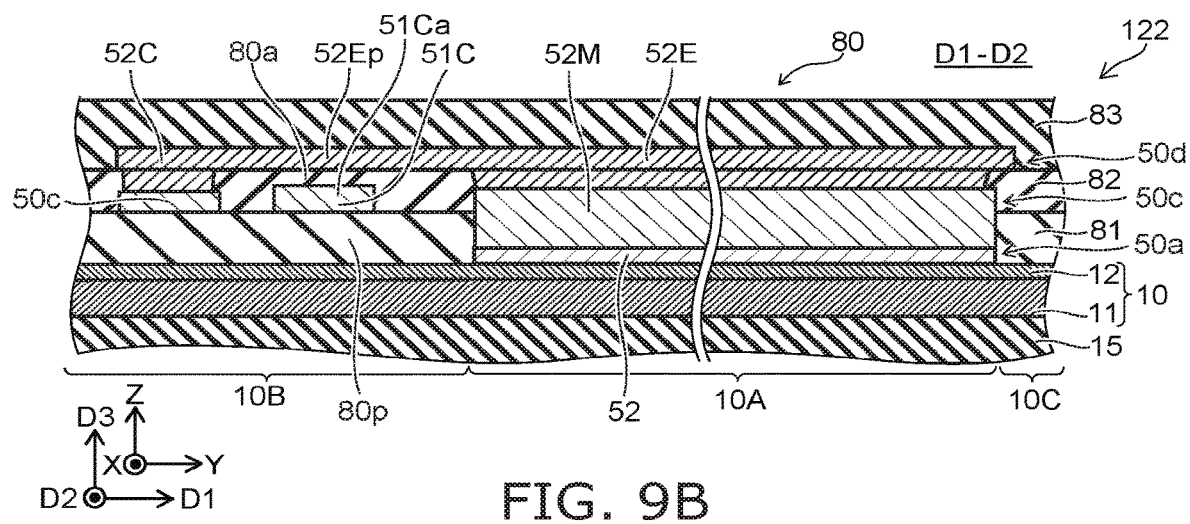
Figure 9C:
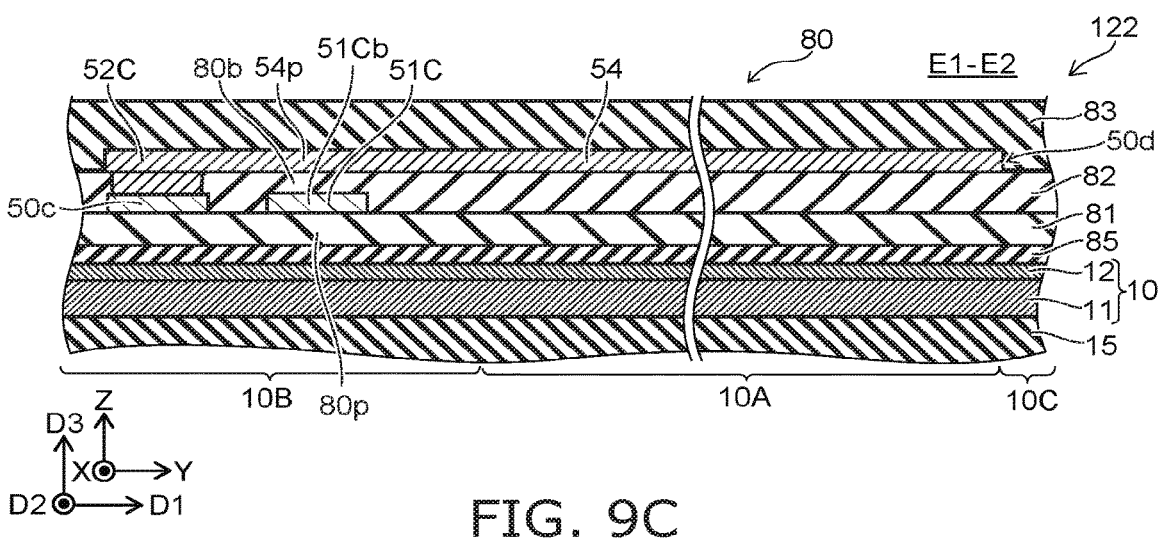

FIG. 9A to FIG. 9C are schematic cross-sectional views illustrating a semiconductor device according to the second embodiment.

FIG. 9A is a cross-sectional view corresponding to the line B1-B2 cross section of FIG. 6A. FIG. 9B is a cross-sectional view corresponding to the line D1-D2 cross section of FIG. 6A. FIG. 9C is a cross-sectional view corresponding to the line E1-E2 cross section of FIG. 6A.

In the example as shown in FIG. 9A to FIG. 9C, the first electrode connection portion 51C includes the first connection conductive layer 51Ca. In such a case as well, the direction from the first connection conductive layer 51Ca toward the first intermediate conductive layer 51M is along the first plane (the X-Y plane) recited above. As shown in FIG. 9B, the direction from the first connection conductive layer 51Ca toward the second intermediate conductive layer 52M is along the first plane (the X-Y plane) recited above. The first connection conductive layer 51Ca, the first intermediate conductive layer 51M, and the second intermediate conductive layer 52M are, for example, at least a portion of the third conductive layer 50c.

As shown in FIG. 9B and FIG. 9C, a portion 80p of the insulating member 80 is between the semiconductor layer 10 and the first connection conductive layer 51Ca in the third direction D3.

In the semiconductor devices 121 and 122 as well, a small size of the device can be maintained. The concentration of the electric field can be suppressed. For example, the source-drain parasitic capacitance can be small. The gate resistance can be reduced by the first extension conductive layer 51E. Stable operations are obtained.

The configurations described in reference to the semiconductor devices 110a and 110b also are applicable to the semiconductor devices 120 to 122. For example, the intermediate electrode 51N that is electrically connected to the second electrode 52 (FIG. 3A and FIG. 3B) may be provided. The position of the intermediate electrode 51N in the third direction D3 is between the position of the first electrode 51 in the third direction D3 and the position of the first extension conductive layer 51E in the third direction D3. The position of the intermediate electrode 51N in the second direction D2 is between the position of the first electrode 51 in the second direction D2 and the position of the third electrode 53 in the second direction D2. For example, the connection portion 54v may be provided (referring to FIG. 3B). The connection portion 54v electrically connects the intermediate electrode 51N to the fourth electrode 54.

The configuration described in reference to the first embodiment is applicable to the semiconductor device according to the second embodiment.

Figure 10:
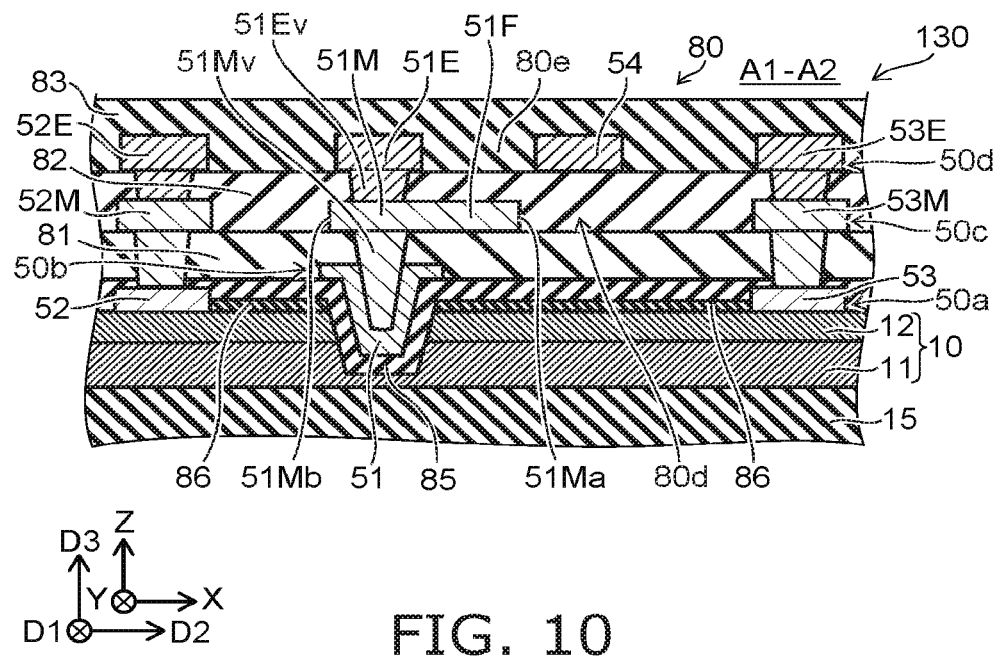
FIG. 10 is a schematic cross-sectional view illustrating a semiconductor device according to the embodiment.
Figure 11:
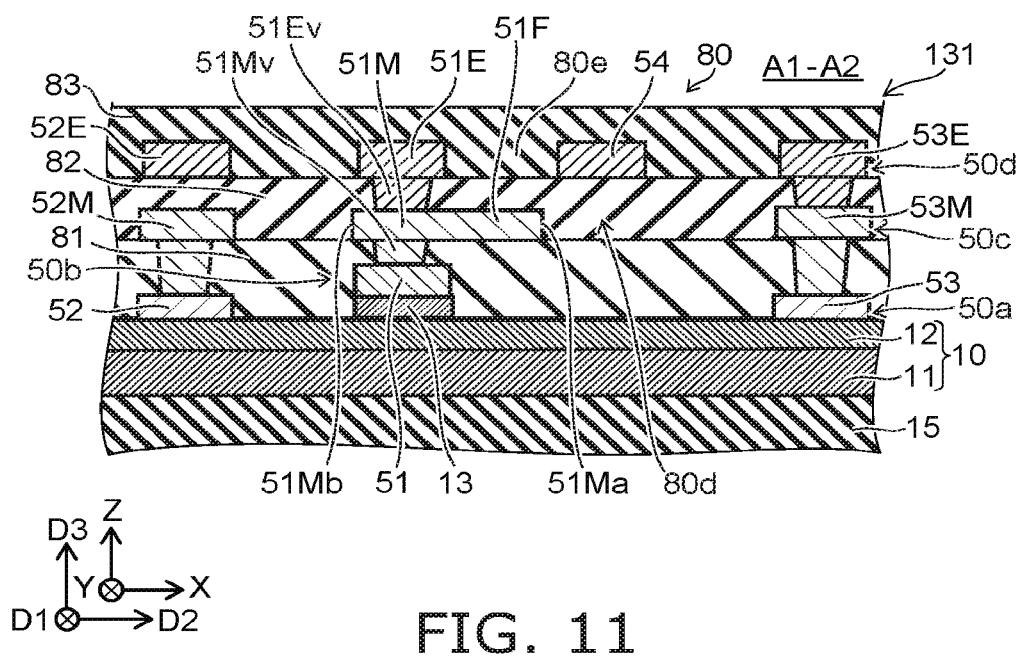
FIG. 11 is a schematic cross-sectional view illustrating a semiconductor device according to the embodiment.

FIG. 10 and FIG. 11 are schematic cross-sectional views illustrating semiconductor devices according to the embodiment.

These drawings are cross-sectional views corresponding to the line A1-A2 cross section of FIG. 1A or FIG. 6A.

In a semiconductor device 130 according to the embodiment as shown in FIG. 10, the direction from a portion (e.g., the lower end) of the first electrode 51 toward the first semiconductor region 11 is aligned with the second direction D2. For example, the first electrode 51 is a trench gate electrode. Thereby, for example, the threshold voltage can be increased. For example, a normally-off operation is obtained.

An intermediate insulating film 86 is provided in the example. The intermediate insulating film 86 is provided between the insulating film 85 and the semiconductor layer 10. For example, the intermediate insulating film 86 includes silicon and nitrogen. The insulating film 85 includes, for example, silicon and oxygen. The insulating film 85 includes, for example, aluminum and oxygen. The insulating film 85 may be bilayer films. For example, the insulating film 85 may be bilayer films including a film of $SiO_2$ and a film of AlN. The semiconductor layer 10 is protected by the intermediate insulating film 86. Stable characteristics are obtained easily. For example, the current collapse can be suppressed.

As shown in FIG. 11, a semiconductor device 131 may further include a semiconductor film 13. The third semiconductor film 13 is provided between the semiconductor layer 10 and the third electrode 53. The semiconductor film 13 includes, for example, $Al_{x3}Ga_{1-x3}N$ ($0 \leq x3 \leq 1$). The semiconductor film 13 further includes, for example, at least one first element selected from the group consisting of Mg, Zn, and C. The first element functions as a p-type impurity. Thereby, for example, the threshold voltage can be increased. For example, a normally-off operation is obtained. The insulating film 85 may be omitted when the semiconductor film 13 is provided.

The configurations described in reference to the semiconductor devices 130 and 131 are applicable to the semiconductor device according to the first embodiment or the second embodiment and semiconductor devices of modifications of the first embodiment or the second embodiment.

Third Embodiment

Figure 12A:
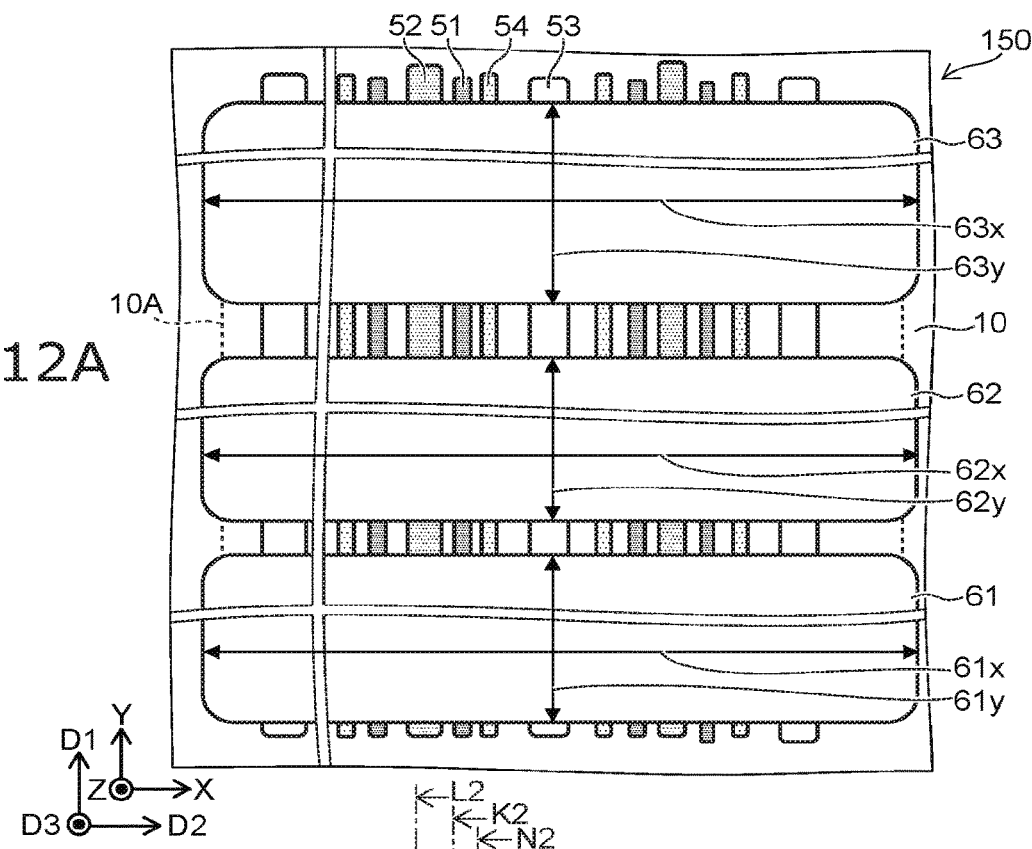
FIG. 12A and FIG. 12B are schematic plan views illustrating a semiconductor device according to a third embodiment.
Figure 12B:
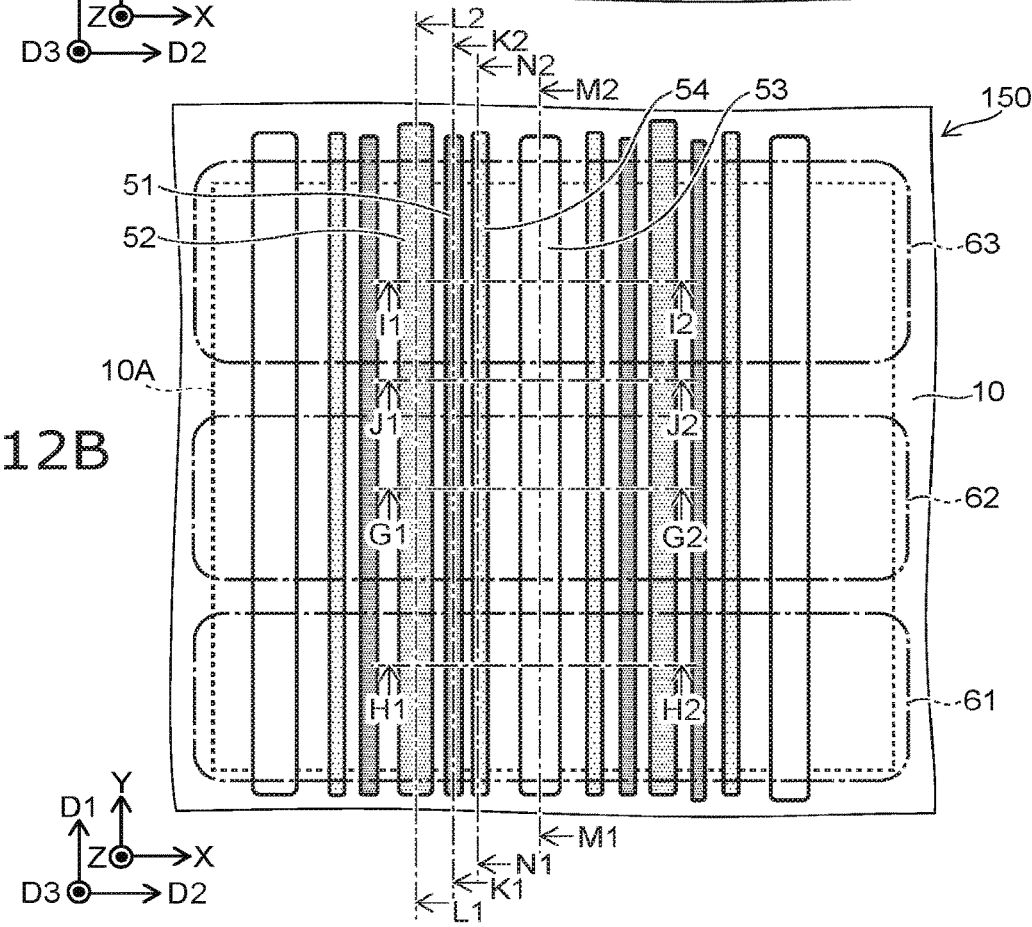

FIG. 12A and FIG. 12B are schematic plan views illustrating a semiconductor device according to a third embodiment.

FIG. 13 to FIG. 20 are schematic cross-sectional views illustrating the semiconductor device according to the third embodiment.

Figure 13:
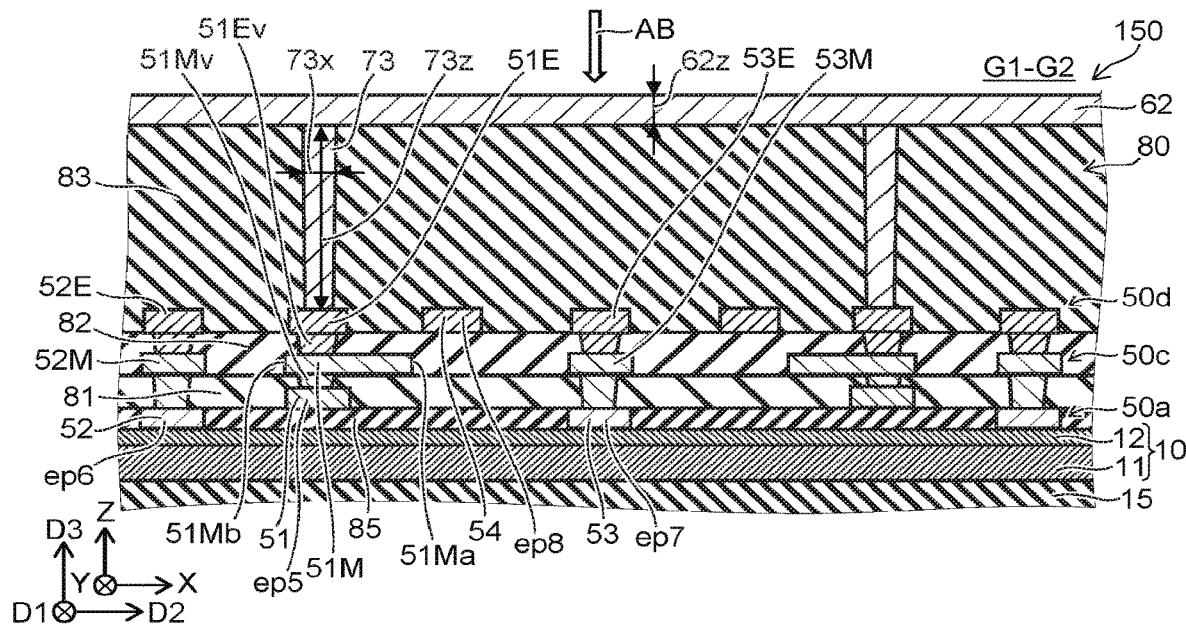
FIG. 13 is a schematic cross-sectional view illustrating the semiconductor device according to the third embodiment.
Figure 14:
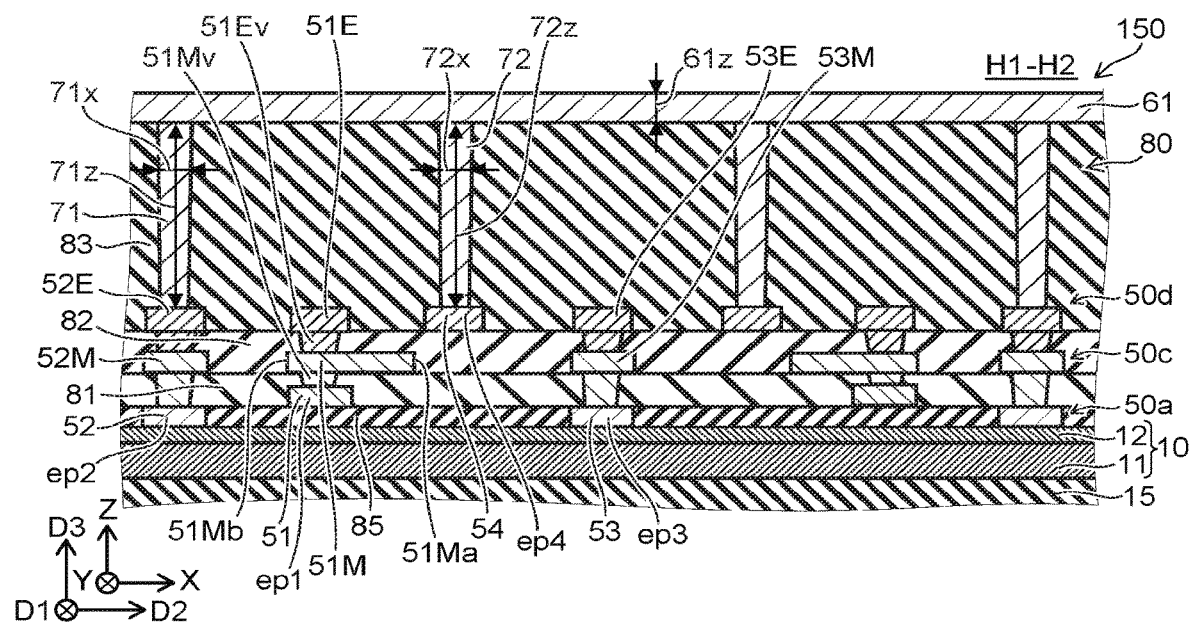
FIG. 14 is a schematic cross-sectional view illustrating the semiconductor device according to the third embodiment.
Figure 15:
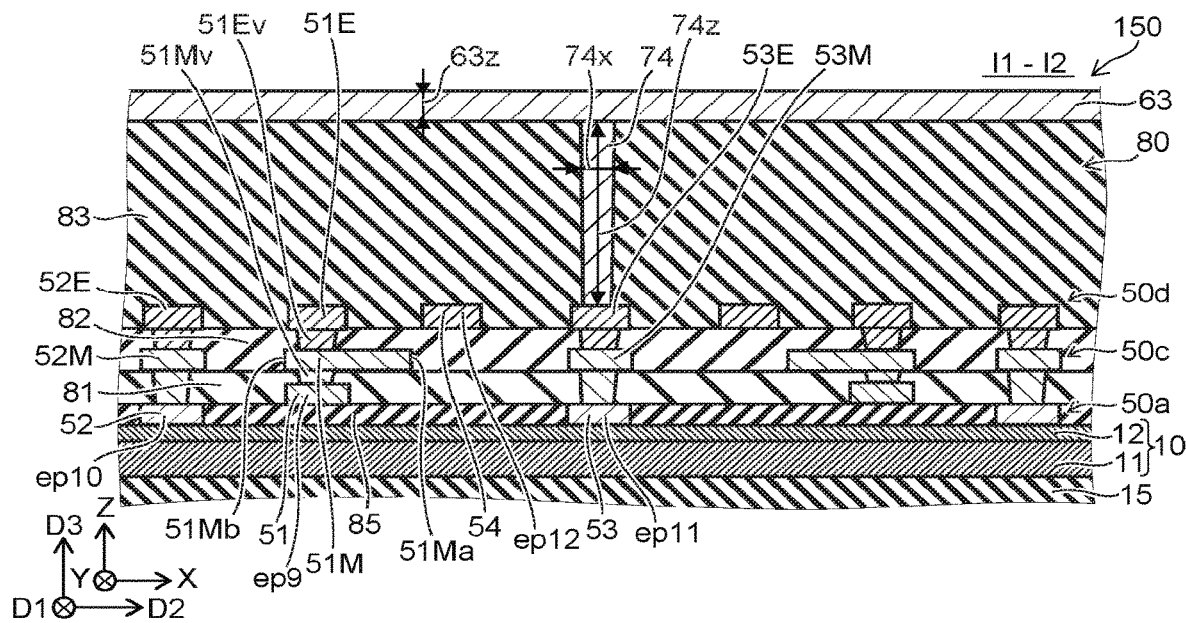
FIG. 15 is a schematic cross-sectional view illustrating the semiconductor device according to the third embodiment.
Figure 16:
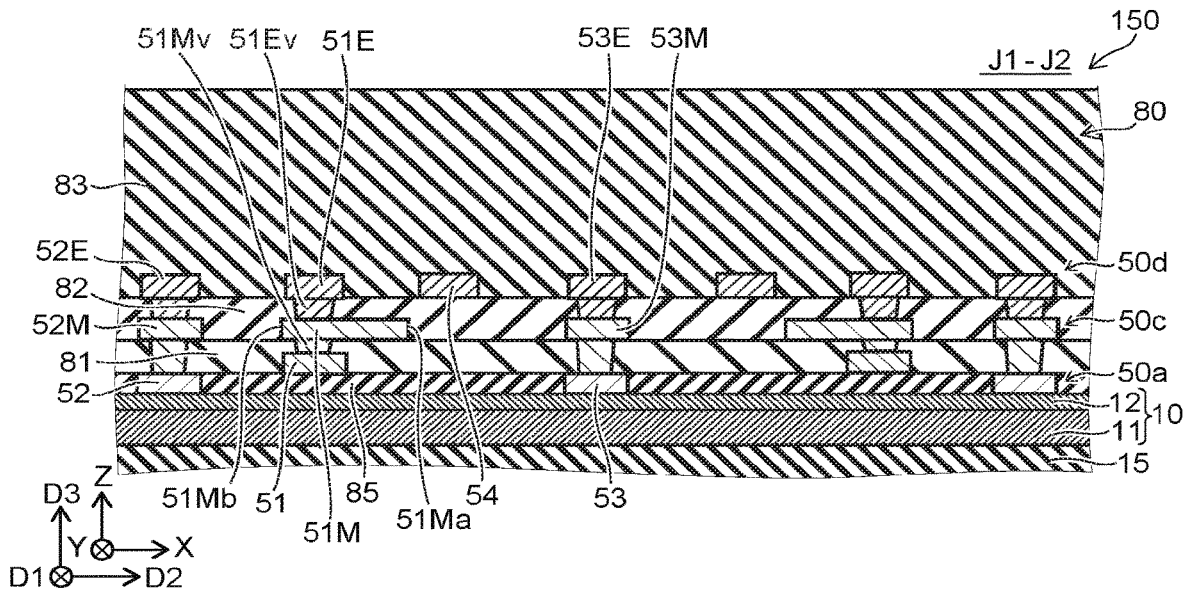
FIG. 16 is a schematic cross-sectional view illustrating the semiconductor device according to the third embodiment.
Figure 17:
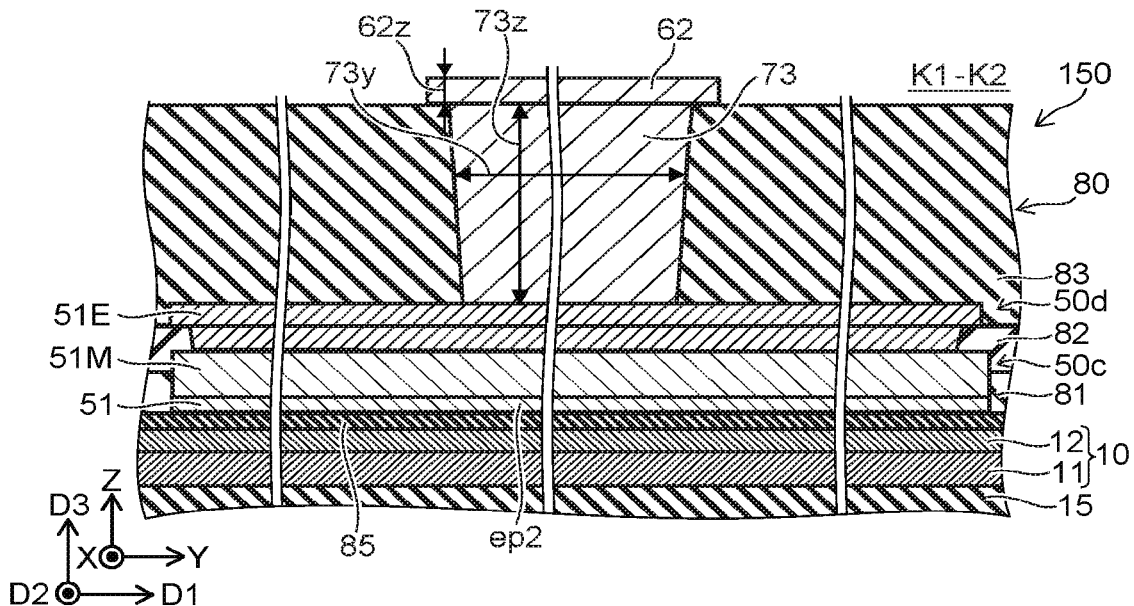
FIG. 17 is a schematic cross-sectional view illustrating the semiconductor device according to the third embodiment.
Figure 18:
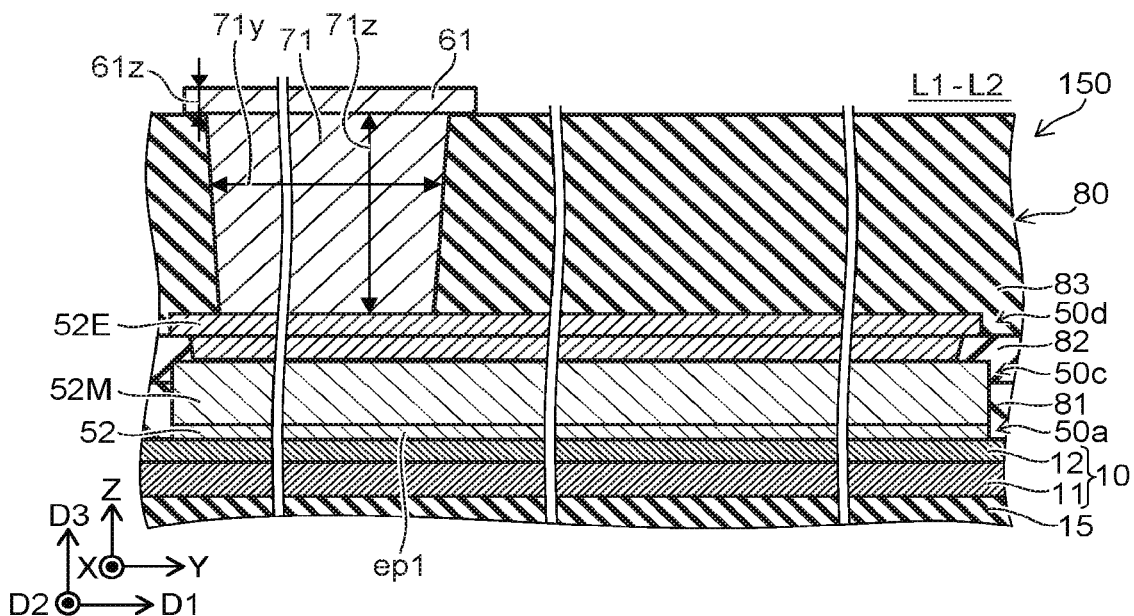
FIG. 18 is a schematic cross-sectional view illustrating the semiconductor device according to the third embodiment.
Figure 19:
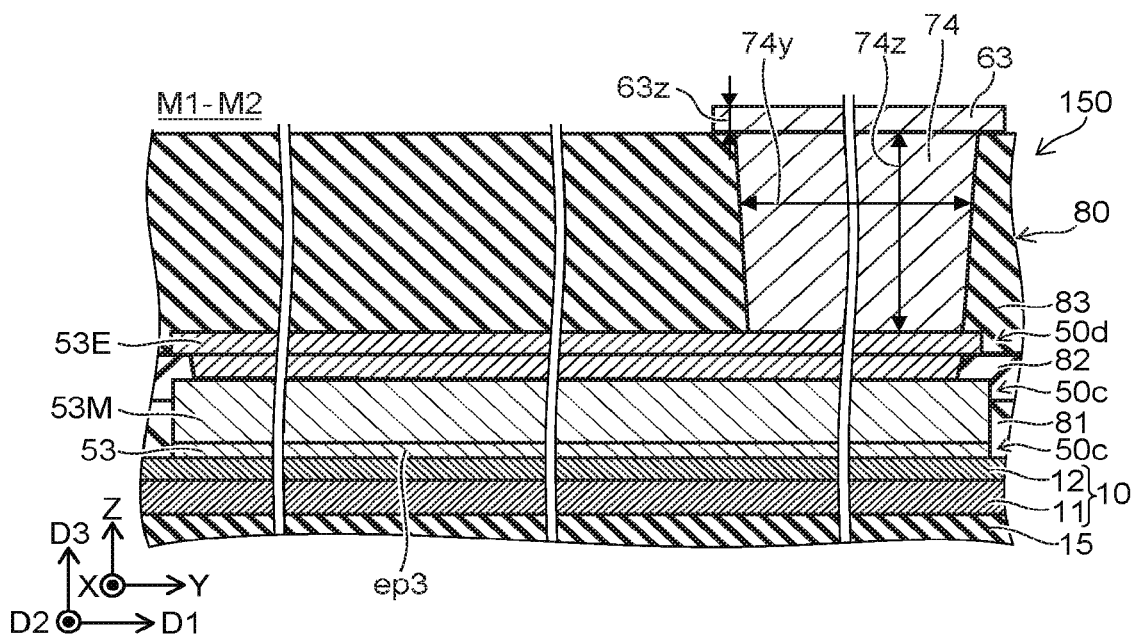
FIG. 19 is a schematic cross-sectional view illustrating the semiconductor device according to the third embodiment.
Figure 20:
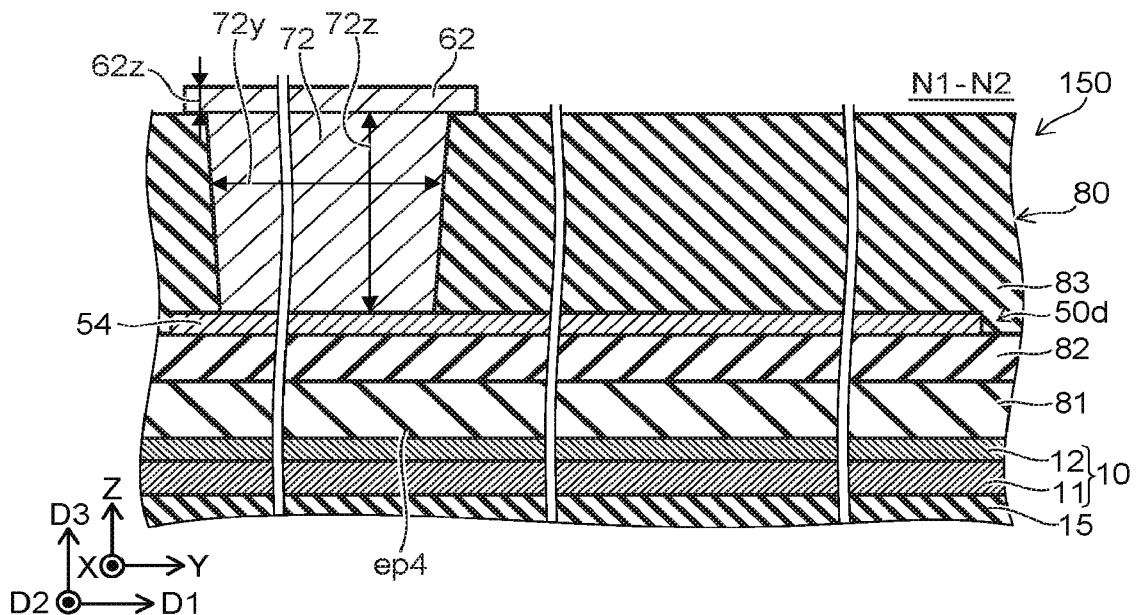
FIG. 20 is a schematic cross-sectional view illustrating the semiconductor device according to the third embodiment.

FIG. 12A and FIG. 12B are plan views when viewed along arrow AB of FIG. 13. FIG. 12B is a plan view in which first to third pad parts 61 to 63 described below are removed. FIG. 13 is a line G1-G2 cross-sectional view of FIG. 12B. FIG. 14 is a line H1-H2 cross-sectional view of FIG. 12B. FIG. 15 is a line 11-12 cross-sectional view of FIG. 12B. FIG. 16 is a line J1-J2 cross-sectional view of FIG. 12B. FIG. 17 is a line K1-K2 cross-sectional view of FIG. 12B. FIG. 18 is a line L1-L2 cross-sectional view of FIG. 12B. FIG. 19 is a line M1-M2 cross-sectional view of FIG. 12B. FIG. 20 is a line N1-N2 cross-sectional view of FIG. 12B.

As shown in FIG. 12A and FIG. 12B, the semiconductor device 150 according to the embodiment includes the first electrode 51, the second electrode 52, the third electrode 53, the semiconductor layer 10, and the first pad part 61. In the example, the semiconductor device 150 further includes the second pad part 62 and the third pad part 63.

As shown in FIG. 14, the semiconductor device 150 further includes a first connection member 71 and a second connection member 72.

As shown in FIG. 12A and FIG. 12B, the first electrode 51, the second electrode 52, the third electrode 53, and the fourth electrode 54 extend along the first direction D1. The first direction D1 is, for example, the Y-axis direction. One direction perpendicular to the Y-axis direction is taken as the X-axis direction. A direction perpendicular to the X-axis direction and the Y-axis direction is taken as the Z-axis direction.

One direction that crosses the first direction D1 is taken as the second direction D2. One direction that crosses a plane including the first direction D1 and the second direction D2 is taken as the third direction D3. The second direction D2 is, for example, the X-axis direction. The third direction D3 is, for example, the Z-axis direction.

The length along the first direction D1 of the first electrode 51 is longer than the length along the second direction D2 of the first electrode 51. The length along the first direction D1 of the first electrode 51 is longer than the length along the third direction D3 of the first electrode 51.

The length along the first direction D1 of the second electrode 52 is longer than the length along the second direction D2 of the second electrode 52. The length along the first direction D1 of the second electrode 52 is longer than the length along the third direction D3 of the second electrode 52.

The length along the first direction D1 of the third electrode 53 is longer than the length along the second direction D2 of the third electrode 53. The length along the first direction D1 of the third electrode 53 is longer than the length along the third direction D3 of the third electrode 53.

The length along the first direction D1 of the fourth electrode 54 is longer than the length along the second direction D2 of the fourth electrode 54. The length along the first direction D1 of the fourth electrode 54 is longer than the length along the third direction D3 of the fourth electrode 54.

The position of the first electrode 51 in the second direction D2 is between the position of the second electrode 52 in the second direction D2 and the position of the third electrode 53 in the second direction D2.

The position of the fourth electrode 54 in the second direction D2 is between the position of the first electrode 51 in the second direction D2 and the position of the third electrode 53 in the second direction D2.

As shown in FIG. 13, the direction from the semiconductor layer 10 toward the first electrode 51, the direction from the semiconductor layer 10 toward the second electrode 52, the direction from the semiconductor layer 10 toward the third electrode 53, and the direction from the semiconductor layer 10 toward the fourth electrode 54 are aligned with the third direction D3.

The semiconductor layer 10 includes, for example, the first semiconductor region 11 and the second semiconductor region 12. The second semiconductor region 12 is between the first semiconductor region 11 and the first electrode 51. The substrate 15 is provided in the example. The first semiconductor region 11 is between the substrate 15 and the second semiconductor region 12. The first semiconductor region 11 includes, for example, $Al_{x1}Ga_{1-x1}N$ ($0 \leq x1 < 1$). The first semiconductor region 11 includes, for example, GaN. The second semiconductor region 12 includes, for example, $Al_{x2}Ga_{1-x2}N$ ($0 < x2 \leq 1$ and $x1 < x2$).

As shown in FIG. 14, a first electrode portion ep1 of the first electrode 51, a second electrode portion ep2 of the second electrode 52, a third electrode portion ep3 of the third electrode 53, and a fourth electrode portion ep4 of the fourth electrode 54 are between the semiconductor layer 10 and the first pad part 61.

As shown in FIG. 14, the first connection member 71 is provided between the first pad part 61 and the second electrode 52. The first connection member 71 electrically connects the first pad part 61 to the second electrode 52. In the example, the first connection member 71 is electrically connected to the second electrode 52 via the second extension conductive layer 52E and the second intermediate conductive layer 52M.

The second connection member 72 is provided between the first pad part 61 and the fourth electrode 54. The second connection member 72 electrically connects the first pad part 61 to the fourth electrode 54. For example, the direction from the second extension conductive layer 52E toward the fourth electrode 54 is aligned with the second direction D2.

For example, the first electrode 51 functions as a gate electrode. For example, the second electrode 52 functions as a source electrode. For example, the third electrode 53 functions as a drain electrode. The semiconductor device 110 is, for example, a transistor.

The fourth electrode 54 is electrically connected to the second electrode 52 by the first pad part 61. For example, the fourth electrode 54 functions as a field plate. The concentration of the electric field can be suppressed by the field plate; and more stable operations are obtained.

The first pad part 61 overlaps the first to fourth electrodes 51 to 54 in the Z-axis direction. The first pad part 61 overlaps the first region 10A of the semiconductor layer 10 in the Z-axis direction (referring to FIG. 12B). The first region 10A is, for example, an active region. For example, the first pad part 61 functions as a source pad part. A region that is used as a pad part can be omitted.

As shown in FIG. 12B and FIG. 16, a pad part is not provided between the second pad part 62 and the third pad part 63.

As shown in FIG. 18, the length along the first direction D1 of the first connection member 71 is taken as a length 71y. As shown in FIG. 14, the length along the second direction D2 of the first connection member 71 is taken as a length 71x. As shown in FIG. 14 and FIG. 18, the length along the third direction D3 of the first connection member 71 is taken as a length 71z. For example, the length 71y along the first direction D1 of the first connection member 71 is longer than the length 71x along the second direction D2 of the first connection member 71. The length 71z along the third direction D3 of the first connection member 71 may be longer than the length 71x along the second direction D2 of the first connection member 71.

As shown in FIG. 20, the length along the first direction D1 of the second connection member 72 is taken as a length 72y. As shown in FIG. 14, the length along the second direction D2 of the second connection member 72 is taken as a length 72x. As shown in FIG. 14 and FIG. 20, the length along the third direction D3 of the second connection member 72 is taken as a length 72z. For example, the length 72y along the first direction D1 of the second connection member 72 is longer than the length 72x along the second direction D2 of the second connection member 72. The length 72z along the third direction D3 of the second connection member 72 may be longer than the length 72x along the second direction D2 of the second connection member 72.

As shown in FIG. 12A, the length along the second direction D2 of the first pad part 61 is taken as a length 61x. The length along the first direction D1 of the first pad part 61 is taken as a length 61y. As shown in FIG. 14, the length along the third direction D3 of the first pad part 61 is taken as a length 61z. In one example, the length 61x is longer than the length 61y. For example, the length 61z is shorter than the length 61x.

As shown in FIG. 13, the semiconductor device 150 includes the second pad part 62 and a third connection member 73. A fifth electrode portion ep5 of the first electrode 51, a sixth electrode portion ep6 of the second electrode 52, a seventh electrode portion ep7 of the third electrode 53, and an eighth electrode portion ep8 of the fourth electrode 54 are between the semiconductor layer 10 and the second pad part 62.

The third connection member 73 is provided between the second pad part 62 and the first electrode 51. The third connection member 73 electrically connects the second pad part 62 to the first electrode 51. In the example, the third connection member 73 is electrically connected to the first electrode 51 via the first extension conductive layer 51E and the first intermediate conductive layer 51M.

The first extension conductive layer 51E is electrically connected to the first electrode 51 by the first intermediate conductive layer 51M. In the example, the first extension conductive layer 51E is electrically connected to the first intermediate conductive layer 51M by the connection conductive part 51Ev. In the example, the first intermediate conductive layer 51M is electrically connected to the first electrode 51 by the connection conductive part 51Mv. Each boundary between the first electrode 51, the connection conductive part 51Mv, the first intermediate conductive layer 51M, the connection conductive part 51Ev, and the first extension conductive layer 51E may be distinct or indistinct. At least a portion of these portions may have a substantially continuous body.

For example, the first intermediate conductive layer 51M includes the first end portion 51Ma. The first intermediate conductive layer 51M may include the second end portion 51Mb. The direction from the second end portion 51Mb toward the first end portion 51Ma is aligned with the second direction D2. The position of the first end portion 51Ma in the second direction D2 is between the position of the first electrode 51 in the second direction D2 and the position of the third electrode 53 in the second direction D2. In the example, the position of the fourth electrode 54 in the second direction D2 is between the position of the first end portion 51Ma in the second direction and the position of the third electrode 53 in the second direction D2. At least a portion of the fourth electrode 54 may overlap the first intermediate conductive layer 51M in the third direction D3. For example, the fourth electrode 54 may overlap the first end portion 51Ma in the third direction D3.

The second pad part 62 overlaps the first to fourth electrodes 51 to 54 in the Z-axis direction. The second pad part 62 overlaps the first region 10A of the semiconductor layer 10 in the Z-axis direction (referring to FIG. 12B). For example, the second pad part 62 functions as a gate pad part. A region that is used as a pad part can be omitted.

As shown in FIGS. 12A and 12B, the direction from the first pad part 61 toward the second pad part 62 is aligned with the first direction D1.

As shown in FIG. 17, the length along the first direction D1 of the third connection member 73 is taken as a length 73y. As shown in FIG. 13, the length along the second direction D2 of the third connection member 73 is taken as a length 73x. As shown in FIG. 13 and FIG. 17, the length along the third direction D3 of the third connection member 73 is taken as a length 73z. For example, the length 73y is longer than the length 73x. For example, the length 73z may be longer than the length 73x.

As shown in FIG. 12A, the length along the second direction D2 of the second pad part 62 is taken as a length 62x. The length along the first direction D1 of the second pad part 62 is taken as a length 62y. As shown in FIG. 13 and FIG. 17, the length along the third direction D3 of the second pad part 62 is taken as a length 62z. In one example, the length 62x may be longer than the length 62y. For example, the length 62z is shorter than the length 62y.

As shown in FIG. 15, the semiconductor device 150 includes the third pad part 63 and a fourth connection member 74. A ninth electrode portion ep9 of the first electrode 51, a tenth electrode portion ep10 of the second electrode 52, an eleventh electrode portion ep11 of the third electrode 53, and a twelfth electrode portion ep12 of the fourth electrode 54 are between the semiconductor layer 10 and the third pad part 63.

The fourth connection member 74 is provided between the third pad part 63 and the third electrode 53. The fourth connection member 74 electrically connects the third pad part 63 to the third electrode 53. In the example, the fourth connection member 74 is electrically connected to the third electrode 53 via the third extension conductive layer 53E and the third intermediate conductive layer 53M.

The third pad part 63 overlaps the first to fourth electrodes 51 to 54 in the Z-axis direction. The third pad part 63 overlaps the first region 10A of the semiconductor layer 10 in the Z-axis direction (referring to FIG. 12B). For example, the third pad part 63 functions as a drain pad part. A region that is used as a pad part can be omitted. For example, the parasitic capacitance between the third pad part 63 and the substrate 15 can be small. For example, the source-drain capacitance can be small. For example, switching loss can be suppressed. For example, the switching operation is stable.

As shown in FIG. 12A, for example, the direction from the first pad part 61 toward the third pad part 63 is aligned with the first direction D1. For example, the second pad part 62 is between the first pad part 61 and the third pad part 63 in the first direction D1.

As shown in FIG. 19, the length along the first direction D1 of the fourth connection member 74 is taken as a length 74y. As shown in FIG. 15, the length along the second direction D2 of the fourth connection member 74 is taken as a length 74x. As shown in FIG. 15 and FIG. 19, the length along the third direction D3 of the fourth connection member 74 is taken as a length 74z. For example, the length 74y is longer than the length 74x. For example, the length 74z is longer than the length 74x.

As shown in FIG. 12A, the length along the second direction D2 of the third pad part 63 is taken as a length 63x. The length along the first direction D1 of the third pad part 63 is taken as a length 63y. As shown in FIG. 15 and FIG. 19, the length along the third direction D3 of the third pad part 63 is taken as a length 63z. In one example, the length 63x is longer than the length 63y. For example, the length 63z is shorter than the length 63y.

The configuration described in reference to the first embodiment or the second embodiment is applicable to the third embodiment. For example, the semiconductor device 150 includes the insulating member 80. The semiconductor device 150 includes, for example, the first to third insulating layers 81 to 83. In the third embodiment, the third insulating layer 83 may include a resin. The resin includes, for example, polyimide. The semiconductor device 150 may include the insulating film 85. For example, the insulating film 85 is provided between the semiconductor layer 10 and the first electrode 51. The semiconductor device 150 may include, for example, the first to fourth conductive layers 50a to 50d. The configurations described in reference to the semiconductor devices 130 and 131 are applicable to the semiconductor device according to the third embodiment and semiconductor devices of modifications of the third embodiment.

Examples of the materials included in the semiconductor device will now be described.

The first electrode 51 includes, for example, at least one selected from the group consisting of Al, Ti, TiN, WN, TaN, Ni, Au, and Pt. The second electrode 52 and the third electrode 53 include, for example, at least one selected from the group consisting of Ti, Al, and Ta. The fourth electrode 54 and the first to third extension conductive layers 51E to 53E include, for example, at least one selected from the group consisting of Al, Cu, Au, and Ag. The first to third intermediate conductive layers 51M to 53M include, for example, at least one selected from the group consisting of Al, Cu, Au, and Ag.

At least one of the first insulating layer 81, the second insulating layer 82, or the third insulating layer 83 includes, for example, at least one selected from the group consisting of silicon oxide, silicon nitride, silicon oxynitride, and aluminum oxide. The third insulating layer 83 may include, for example, polyimide. The insulating film 85 includes, for example, silicon oxide.

The embodiments include the following configurations (e.g., technological proposals).

Configuration 1

A semiconductor device, comprising:

a first electrode extending along a first direction;

a second electrode extending along the first direction;

a third electrode extending along the first direction, a position of the first electrode in a second direction being between a position of the second electrode in the second direction and a position of the third electrode in the second direction, the second direction crossing the first direction;

a fourth electrode extending along the first direction, a position of the fourth electrode in the second direction being between the position of the first electrode in the second direction and the position of the third electrode in the second direction;

a semiconductor layer, a direction from the semiconductor layer toward the first electrode, a direction from the semiconductor layer toward the second electrode, a direction from the semiconductor layer toward the third electrode, and a direction from the semiconductor layer toward the fourth electrode being aligned with a third direction crossing a first plane including the first direction and the second direction;

a first pad part, a first electrode portion of the first electrode, a second electrode portion of the second electrode, a third electrode portion of the third electrode, and a fourth electrode portion of the fourth electrode being between the semiconductor layer and the first pad part;

a first connection member electrically connecting the first pad part to the second electrode and being provided between the first pad part and the second electrode; and a second connection member electrically connecting the first pad part to the fourth electrode and being provided between the first pad part and the fourth electrode.

Configuration 2

The semiconductor device according to Configuration 1, wherein a length along the first direction of the first connection member is longer than a length along the second direction of the first connection member.

Configuration 3

The semiconductor device according to Configuration 2, wherein a length along the third direction of the first connection member is longer than a length along the second direction of the first connection member.

Configuration 4

The semiconductor device according to any one of Configurations 1 to 3, wherein a length along the first direction of the second connection member is longer than a length along the second direction of the second connection member.

Configuration 5

The semiconductor device according to Configuration 4, wherein a length along the third direction of the second connection member is longer than a length along the second direction of the second connection member.

Configuration 6

The semiconductor device according to any one of Configurations 1 to 5, wherein a length along the second direction of the first pad part is longer than a length along the first direction of the first pad part.

Configuration 7

The semiconductor device according to Configuration 6, wherein a length along the third direction of the first pad part is shorter than the length along the first direction of the first pad part.

Configuration 8

The semiconductor device according to any one of Configurations 1 to 4, further comprising:

a second pad part; and a third connection member, a fifth electrode portion of the first electrode, a sixth electrode portion of the second electrode, a seventh electrode portion of the third electrode, and an eighth electrode portion of the fourth electrode being between the semiconductor layer and the second pad part, the third connection member electrically connecting the second pad part to the first electrode and being provided between the second pad part and the first electrode.

Configuration 9

The semiconductor device according to Configuration 8, wherein a direction from the first pad part toward the second pad part is aligned with the first direction.

Configuration 10

The semiconductor device according to Configuration 8 or 9, wherein a length along the first direction of the third connection member is longer than a length along the second direction of the third connection member.

Configuration 11

The semiconductor device according to Configuration 10, wherein a length along the third direction of the third connection member is longer than the length along the second direction of the third connection member.

Configuration 12

The semiconductor device according to any one of Configurations 8 to 11, wherein a length along the second direction of the second pad part is longer than a length along the first direction of the second pad part.

Configuration 13

The semiconductor device according to Configuration 12, wherein a length along the third direction of the second pad part is shorter than the length along the first direction of the second pad part.

Configuration 14

The semiconductor device according to any one of Configurations 1 to 13, further comprising:

a third pad part; and a fourth connection member, a ninth electrode portion of the first electrode, a tenth electrode portion of the second electrode, an eleventh electrode portion of the third electrode, and a twelfth electrode portion of the fourth electrode being between the semiconductor layer and the third pad part, the fourth connection member electrically connecting the third pad part to the third electrode and being provided between the third pad part and the third electrode.

Configuration 15

The semiconductor device according to Configuration 14, wherein a direction from the first pad part toward the third pad part is aligned with the first direction.

Configuration 16

The semiconductor device according to Configuration 14 or 15, wherein the second pad part is between the first pad part and the third pad part in the first direction.

Configuration 17

The semiconductor device according to any one of Configurations 14 to 16, wherein a length along the first direction of the fourth connection member is longer than a length along the second direction of the fourth connection member.

Configuration 18

The semiconductor device according to Configuration 17, wherein a length along the third direction of the fourth connection member is longer than the length along the second direction of the fourth connection member.

Configuration 19

The semiconductor device according to any one of Configurations 14 to 18, wherein a length along the second direction of the third pad part is longer than a length along the first direction of the third pad part.

Configuration 20

The semiconductor device according to Configuration 19, wherein a length along the third direction of the third pad part is shorter than the length along the first direction of the third pad part.

According to the embodiments, a semiconductor device can be provided in which stable operations are obtained.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, conductive layers, insulating layers, insulating members, substrates, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode extending along a first direction;
a second electrode extending along the first direction;
a third electrode extending along the first direction, a position of the first electrode in a second direction being between a position of the second electrode in the second direction and a position of the third electrode in the second direction, the second direction crossing the first direction;
a semiconductor layer, a direction from the semiconductor layer toward the first electrode, a direction from the semiconductor layer toward the second electrode, and a direction from the semiconductor layer toward the third electrode being aligned with a third direction crossing a first plane including the first direction and the second direction;
a first extension conductive layer extending along the first direction and being electrically connected to the first electrode, the first electrode being between the semiconductor layer and the first extension conductive layer in the third direction;
a fourth electrode extending along the first direction, a direction from the first extension conductive layer toward the fourth electrode being aligned with the second direction, a position of the fourth electrode in the second direction being between the position of the first electrode in the second direction and the position of the third electrode in the second direction;
a first electrode connection portion electrically connected to the first electrode;
a second electrode connection portion electrically connected to the second electrode and the fourth electrode, a position of the second electrode connection portion in the first direction being between a position of the first electrode connection portion in the first direction and a position of the third electrode in the first direction; and
an insulating member including a first insulating portion, the first insulating portion being between the second electrode connection portion and a portion of the first electrode in the third direction.

2. The device according to claim 1, wherein
the insulating member further includes a second insulating portion, and
the second insulating portion is between the second electrode connection portion and the first extension conductive layer.

3. The device according to claim 1, wherein
the insulating member further includes a third insulating portion, and
the third insulating portion is between the second electrode connection portion and the first electrode connection portion.

4. The device according to claim 1, further comprising a first intermediate conductive layer,
at least a portion of the first intermediate conductive layer being between the first electrode and the first extension conductive layer in the third direction,
the first intermediate conductive layer including a first end portion,
a position of the first end portion in the second direction being between the position of the first electrode in the second direction and the position of the third electrode in the second direction.

5. The device according to claim 4, wherein at least a portion of the first insulating portion is between the first intermediate conductive layer and the second electrode connection portion.

6. The device according to claim 4, wherein at least a portion of the first insulating portion is between the first electrode and the first intermediate conductive layer.

7. The device according to claim 1, further comprising an intermediate electrode electrically connected to the second electrode,
a position of the intermediate electrode in the third direction being between a position of the first electrode in the third direction and a position of the first extension conductive layer in the third direction,
a position of the intermediate electrode in the second direction being between the position of the first electrode in the second direction and the position of the third electrode in the second direction.

8. The device according to claim 7, further comprising a connection portion electrically connecting the intermediate electrode to the fourth electrode.

9. A semiconductor device, comprising:
a first electrode extending along a first direction;
a second electrode extending along the first direction;
a third electrode extending along the first direction, a position of the first electrode in a second direction being between a position of the second electrode in the second direction and a position of the third electrode in the second direction, the second direction crossing the first direction;
a semiconductor layer, a direction from the semiconductor layer toward the first electrode, a direction from the semiconductor layer toward the second electrode, and a direction from the semiconductor layer toward the third electrode being aligned with a third direction crossing a first plane including the first direction and the second direction;
a first extension conductive layer extending along the first direction and being electrically connected to the first electrode, the first electrode being between the semiconductor layer and the first extension conductive layer in the third direction;
a second extension conductive layer extending along the first direction and being electrically connected to the second electrode, the second electrode being between the semiconductor layer and the second extension conductive layer in the third direction;
a fourth electrode extending along the first direction, a direction from the first extension conductive layer toward the fourth electrode being aligned with the second direction, a position of the fourth electrode in the second direction being between the position of the first electrode in the second direction and the position of the third electrode in the second direction;
a first electrode connection portion electrically connected to the first electrode;
a second electrode connection portion electrically connected to the second electrode and the fourth electrode, a position of the first electrode connection portion in the first direction being between a position of the second electrode connection portion in the first direction and a position of the third electrode in the first direction; and
an insulating member including a first insulating portion, the first insulating portion being between the first electrode connection portion and a portion of the second extension conductive layer in the third direction.

10. The device according to claim 9, wherein
the insulating member further includes a second insulating portion, and
the second insulating portion is between the first electrode connection portion and a portion of the fourth electrode.

11. The device according to claim 9, wherein
the insulating member further includes a third insulating portion,
the third insulating portion is between the second electrode connection portion and the first extension conductive layer in the first direction, and
the first electrode connection portion is between the semiconductor layer and the third insulating portion in the third direction.

12. The device according to claim 9, further comprising a first intermediate conductive layer,
at least a portion of the first intermediate conductive layer being between the first electrode and the first extension conductive layer in the third direction,
the first intermediate conductive layer including a first end portion,
a position of the first end portion in the second direction being between the position of the first electrode in the second direction and the position of the third electrode in the second direction.

13. The device according to claim 12, wherein
the first electrode connection portion includes a first connection conductive layer, and
a direction from the first connection conductive layer toward the first intermediate conductive layer is along the first plane.

14. The device according to claim 13, wherein
the first electrode connection portion further includes a second connection conductive layer, and
the second connection conductive layer is between the semiconductor layer and the first connection conductive layer.

15. The device according to claim 14, wherein a direction from the second connection conductive layer toward the second electrode is along the first plane.

16. The device according to claim 13, wherein a portion of the insulating member is between the semiconductor layer and the first connection conductive layer in the third direction.

17. The device according to claim 9, further comprising an intermediate electrode electrically connected to the second electrode,
a position of the intermediate electrode in the third direction being between a position of the first electrode in the third direction and a position of the first extension conductive layer in the third direction,
a position of the intermediate electrode in the second direction being between the position of the first electrode in the second direction and the position of the third electrode in the second direction.

18. A semiconductor device, comprising:
a first electrode extending along a first direction;
a second electrode extending along the first direction;
a third electrode extending along the first direction, a position of the first electrode in a second direction being between a position of the second electrode in the second direction and a position of the third electrode in the second direction, the second direction crossing the first direction;
a fourth electrode extending along the first direction, a position of the fourth electrode in the second direction being between the position of the first electrode in the second direction and the position of the third electrode in the second direction;
a semiconductor layer, a direction from the semiconductor layer toward the first electrode, a direction from the semiconductor layer toward the second electrode, a direction from the semiconductor layer toward the third electrode, and a direction from the semiconductor layer toward the fourth electrode being aligned with a third direction crossing a first plane including the first direction and the second direction;
a first pad part, a first electrode portion of the first electrode, a second electrode portion of the second electrode, a third electrode portion of the third electrode, and a fourth electrode portion of the fourth electrode being between the semiconductor layer and the first pad part;
a first connection member electrically connecting the first pad part to the second electrode and being provided between the first pad part and the second electrode; and
a second connection member electrically connecting the first pad part to the fourth electrode and being provided between the first pad part and the fourth electrode.

19. The device according to claim 18, further comprising:
a second pad part; and
a third connection member,
a fifth electrode portion of the first electrode, a sixth electrode portion of the second electrode, a seventh electrode portion of the third electrode, and an eighth electrode portion of the fourth electrode being between the semiconductor layer and the second pad part, the third connection member electrically connecting the second pad part to the first electrode and being provided between the second pad part and the first electrode.

20. The device according to claim 18, further comprising:
a third pad part; and
a fourth connection member,
a ninth electrode portion of the first electrode, a tenth electrode portion of the second electrode, an eleventh electrode portion of the third electrode, and a twelfth electrode portion of the fourth electrode being between the semiconductor layer and the third pad part,
the fourth connection member electrically connecting the third pad part to the third electrode and being provided between the third pad part and the third electrode.

* * * * *